(12) United States Patent
Hokazono

(10) Patent No.: US 7,554,165 B2
(45) Date of Patent: Jun. 30, 2009

(54) SEMICONDUCTOR DEVICE

(75) Inventor: Akira Hokazono, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 12/110,771

(22) Filed: Apr. 28, 2008

(65) Prior Publication Data
US 2008/0277742 A1 Nov. 13, 2008

(30) Foreign Application Priority Data
Apr. 26, 2007 (JP) ............................. 2007-117055

(51) Int. Cl.
*H01L 29/78* (2006.01)
(52) U.S. Cl. .............................. 257/401; 257/E29.028; 257/E29.264
(58) Field of Classification Search ................. 257/365, 257/401, E29.028, E29.264
See application file for complete search history.

(56) References Cited

U.S. PATENT DOCUMENTS

| | | | |
|---|---|---|---|
| 7,087,471 B2 | 8/2006 | Beintner | |
| 7,129,550 B2 | 10/2006 | Fujiwara et al. | |
| 7,244,666 B2 | 7/2007 | Jin | |
| 7,314,787 B2 * | 1/2008 | Yagishita | 438/197 |
| 2005/0242395 A1 | 11/2005 | Chen et al. | |
| 2006/0166456 A1 | 7/2006 | Fujiwara et al. | |
| 2007/0004117 A1 * | 1/2007 | Yagishita | 438/197 |
| 2007/0034972 A1 * | 2/2007 | Chau et al. | 257/401 |
| 2007/0045736 A1 | 3/2007 | Yagishita | |
| 2009/0020819 A1 * | 1/2009 | Anderson et al. | 257/365 |

FOREIGN PATENT DOCUMENTS

JP 2002-9289 1/2002

OTHER PUBLICATIONS

H. Shang et al., "Investigation of FinFET devices for 32nm technologies and beyond", 2006 Symposium on VLSI Technology Digest of Technical Papers, 2 pages.

* cited by examiner

*Primary Examiner*—Trung Dang
(74) *Attorney, Agent, or Firm*—Oblon, Spivak, McClelland, Maier & Neustadt, P.C.

(57) ABSTRACT

In one aspect of the present invention, a semiconductor device may include a plurality of fins disposed substantially parallel to each other at predetermined intervals on a semiconductor substrate, a gate electrode formed to partially sandwich therein the both side surfaces, in the longitudinal direction, of each of the plurality of fins with an insulating film interposed between the gate electrode and each of the side surfaces of each fin, and a semiconductor layer formed on each of at least some of side surfaces of the plurality of fins, wherein the semiconductor layer in a region located on an outer side surface, in the longitudinal direction, of each of two fins which are located at both ends of the line of the plurality of fins is thinner than the semiconductor layer in a region located on each of side surfaces, in the longitudinal direction and other than the outer surfaces of the two fins, of the plurality of fins.

5 Claims, 24 Drawing Sheets

SEMICONDUCTOR DEVICE

CROSS REFERENCE TO RELATED APPLICATION

This application is based upon and claims the benefit of priority from Japanese Patent Application No. 2007-117055, filed on Apr. 26, 2007, the entire contents of which are incorporated herein by reference.

BACKGROUND

As a type of a double-gate transistor that has a structure in which one or more gate electrodes sandwich the channel region so that the gate electrodes can more positively control current flowing thereunder, there is a fin field effect transistor (FinFET) which is a transistor with a fin structure. In a FinFET, it is important to make its fin thinner since a channel with a fully-depleted structure needs to be formed therein.

However, FinFETs with conventional structures has the following problem. Specifically, since each of such conventional FinFETs has a thin fin, the entire body of the fin is unintentionally silicided while a silicide layer is formed on surfaces of the fin. This increases parasitic resistance in the FinFET. It is difficult to silicide just the vicinity of the surfaces of a thin fin, and even if just the vicinity of the surfaces of a thin fin should be successfully silicided, agglomeration may possibly occur in the thus-formed thin silicide layer during a thermal process of manufacturing processes of the transistor.

Accordingly, techniques to solve the above problem have been heretofore provided. In these techniques, crystals of silicon or the like are epitaxially grown on surfaces of a fin made of silicon, and thereafter a silicide layer is formed on the upper surface of the thus-formed epitaxial-crystal layer, thereby preventing the body of the fin from being entirely silicided. (For example, refer to Japanese Patent Application Publication No. 2005-86024).

Meanwhile, there has been known a type of a FinFET including multiple fins that are arranged in parallel in order to obtain larger gate width and thereby to obtain sufficient current. (For example, refer to Japanese Patent Application Publication No. 2002-9289)

However, in such a FinFET including multiple fins, the multiple fins will naturally require a larger layout area on the substrate of the FinFET. Accordingly, in the case where epitaxial crystals are formed on surfaces of the fins so that the bodies of the fins can be prevented from being entirely silicided, the size of each epitaxial crystal may possibly increased to be in contact with other devices adjacent thereto. This will cause short circuit between the devices.

SUMMARY

Aspects of the invention relate to an improved semiconductor device.

In one aspect of the present invention, a semiconductor device may include a semiconductor substrate, a plurality of fins disposed substantially parallel to each other at predetermined intervals on the semiconductor substrate, a gate electrode formed to partially sandwich therein the both side surfaces, in the longitudinal direction, of each of the plurality of fins with an insulating film interposed between the gate electrode and each of the side surfaces of each fin, and a semiconductor layer formed on each of at least some of side surfaces of the plurality of fins, wherein the semiconductor layer in a region located on an outer side surface, in the longitudinal direction, of each of two fins which are located at both ends of the line of the plurality of fins is thinner than the semiconductor layer in a region located on each of side surfaces, in the longitudinal direction and other than the outer surfaces of the two fins, of the plurality of fins.

In another aspect of the invention, a semiconductor device may include

BRIEF DESCRIPTIONS OF THE DRAWINGS

A more complete appreciation of the invention and many of the attendant advantages thereof will be readily obtained as the same becomes better understood by reference to the following detailed description when considered in connection with the accompanying drawings.

DETAILED DESCRIPTION

Figure 1:
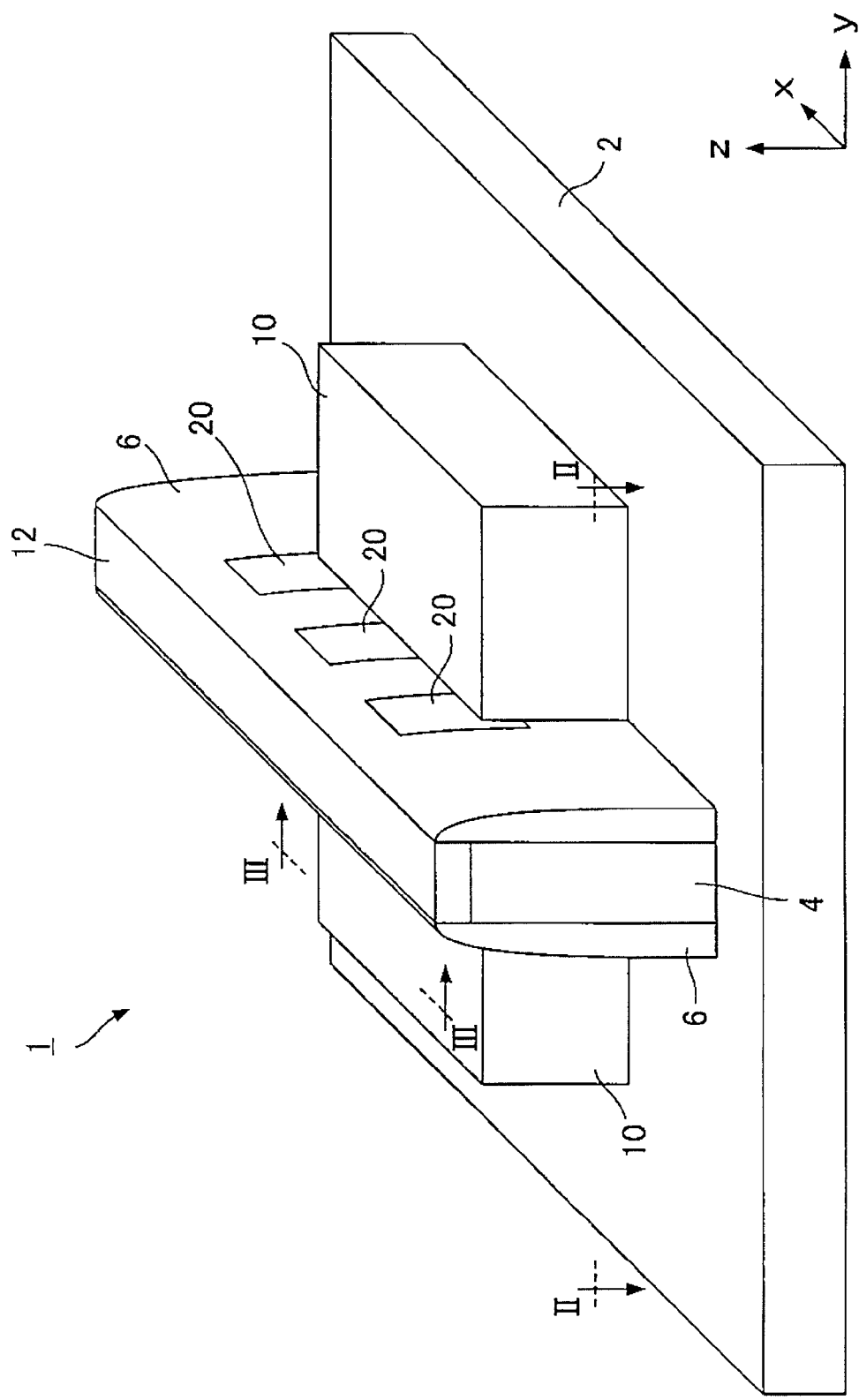
FIG. 1 is a cross sectional view of a semiconductor device in accordance with a first embodiment of the present invention.

Various connections between elements are hereinafter described. It is noted that these connections are illustrated in general and, unless specified otherwise, may be direct or indirect and that this specification is not intended to be limiting in this respect.

Embodiments of the present invention will be explained with reference to the drawings as next described, wherein like reference numerals designate identical or corresponding parts throughout the several views.

FIRST EMBODIMENT (Configuration of Semiconductor Device)

Figure 2A:
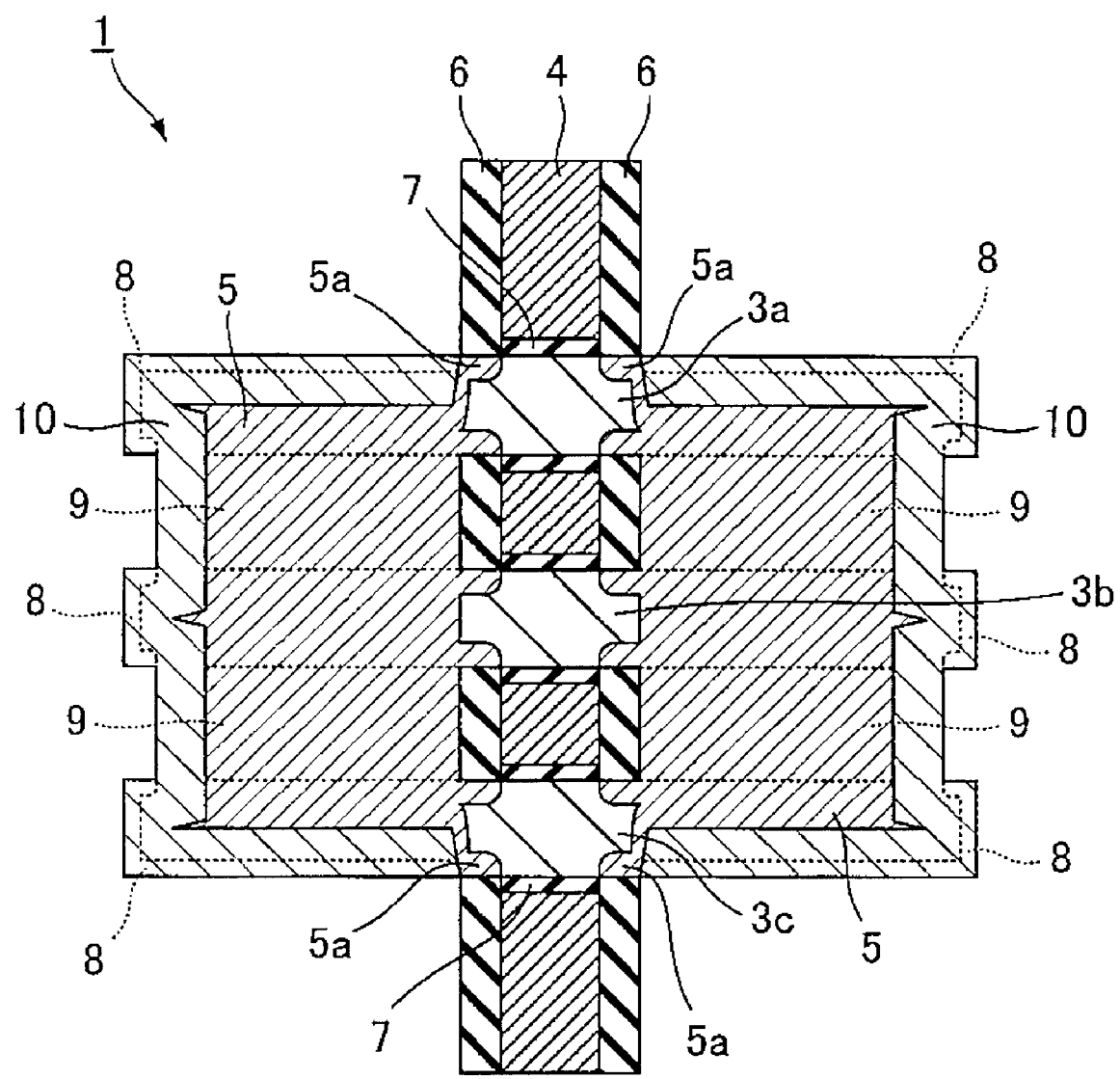
FIG. 2A is a cross-sectional view showing the cross section II-II of FIG. 1 as viewed in the direction of the arrows next to the symbols "II."
Figure 2B:
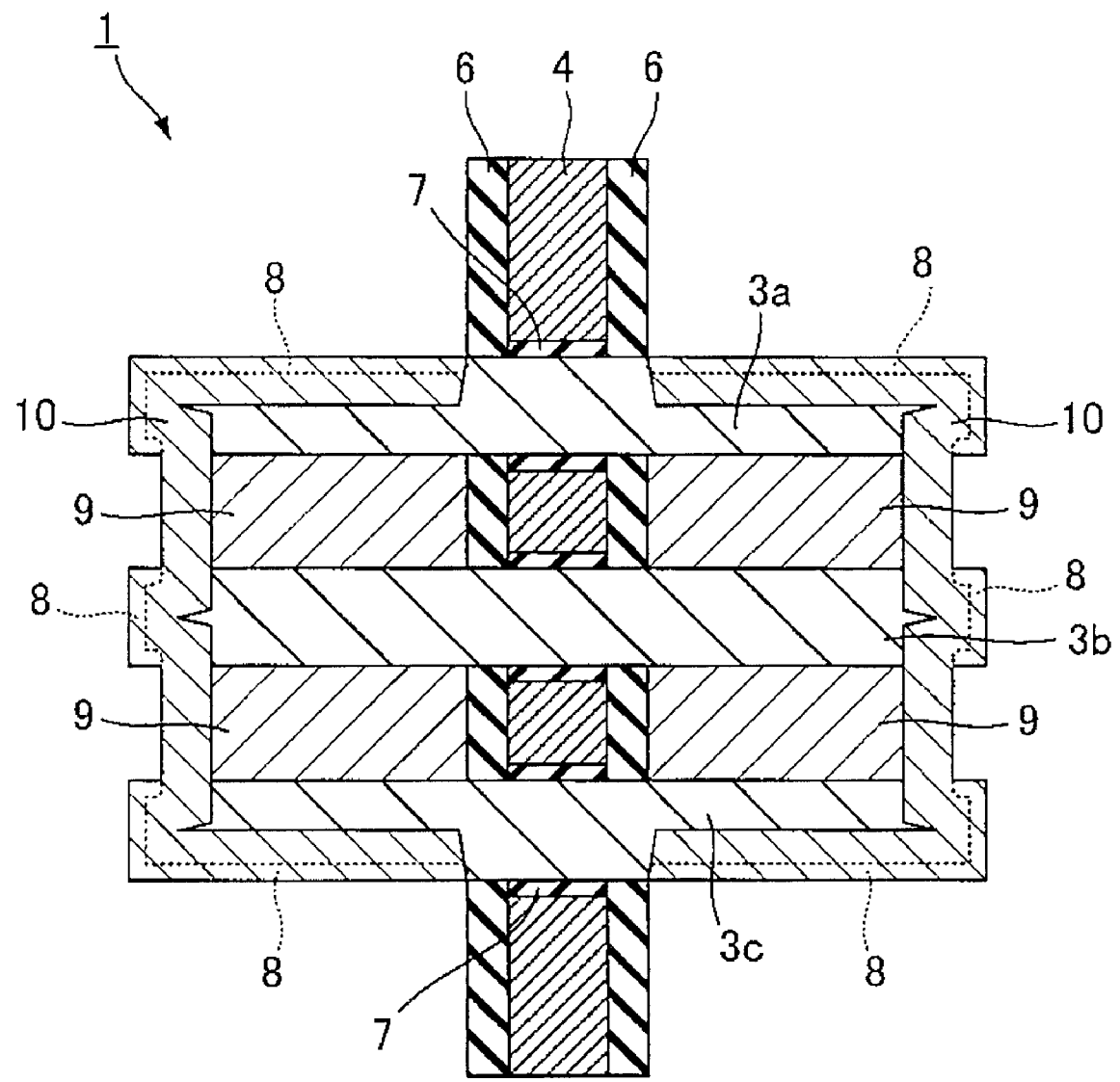
FIG. 2B is a cross-sectional view where source/drain regions 5 and extension regions 5a in FIG. 2A are not shown.
Figure 2B:
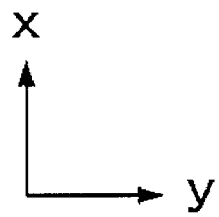
Figure 3A:
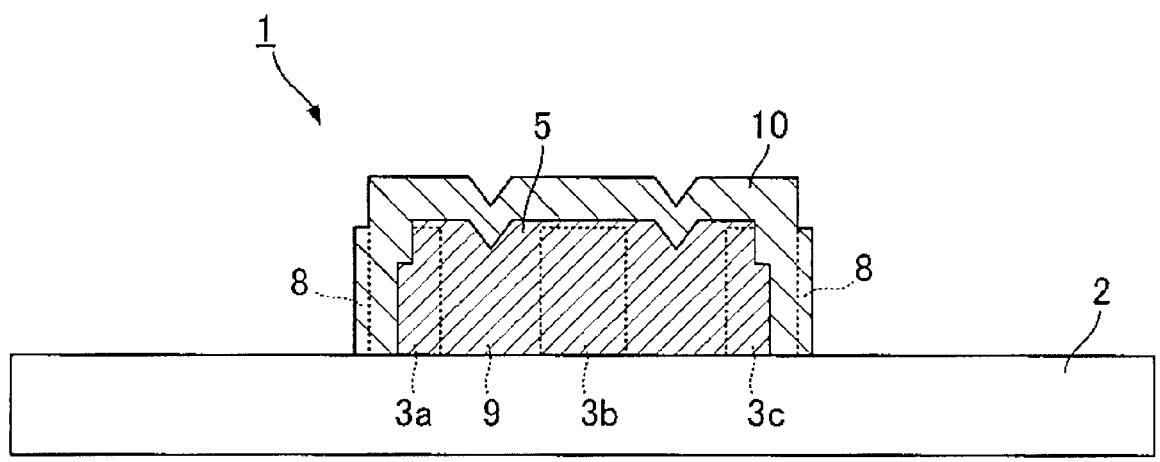
FIG. 3A is a cross-sectional view showing the cross section III-III of FIG. 1 as viewed in the direction of the arrows next to the symbols "III."
Figure 3A:
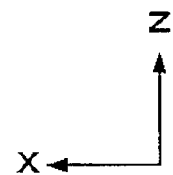
Figure 3B:
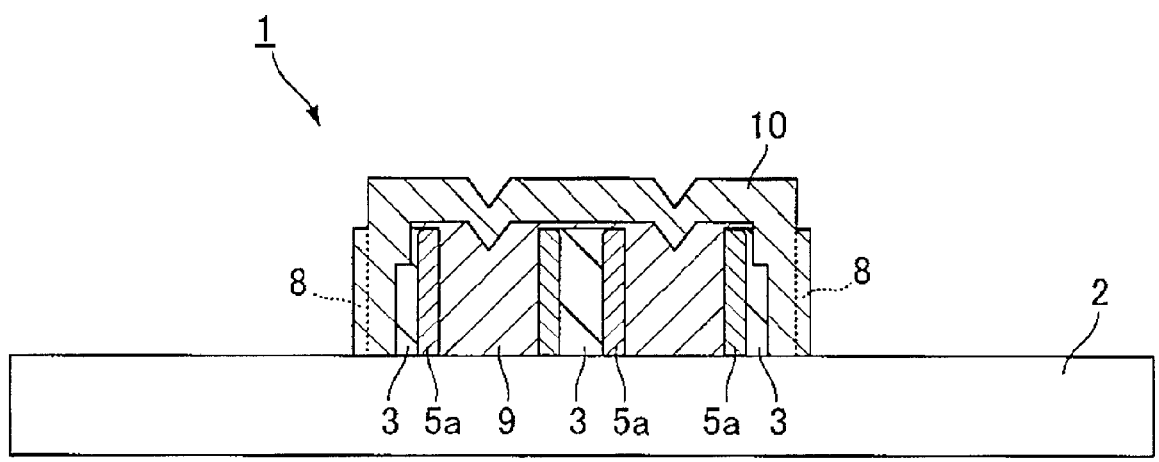
FIG. 3B is a cross-sectional view where the source/drain regions 5 in FIG. 3A are not shown.
Figure 3B:
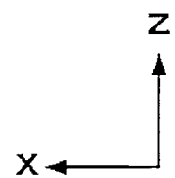

FIG. 1 is a perspective view of a semiconductor device according to a first embodiment of the present invention. FIG. 2A is a cross-sectional view showing the cross section II-II of FIG. 1 as viewed in the direction of the arrows next to the symbols "II." FIG. 2B is a cross-sectional view where source/drain regions 5 and extension regions 5a in FIG. 2A are not shown. FIG. 3A is a cross-sectional view showing the cross section III-III of FIG. 1 as viewed in the direction of the arrows next to the symbols "III." FIG. 3B is a cross-sectional view where the source/drain regions 5 in FIG. 3A are not shown.

The semiconductor device 1 is mainly configured by including: a semiconductor substrate 2; fins 3a, 3b and 3c; a gate electrode 4; epitaxial layers 9; silicide layers 10; and a gate silicide layer 12. The fins 3a to 3c are disposed substantially parallel to each other on the semiconductor substrate 2, with a predetermined space between each adjacent two fins. The gate electrode 4 is formed so as to partially sandwich therein the both side surfaces, in the longitudinal direction, of each of the fins 3a to 3c between each adjacent two separated portions thereof. Between each of the portions of the gate electrode 4 and each of the side surfaces of the fins 3a to 3c, an insulating film 7 is interposed. The epitaxial layer 9 is formed on the upper surfaces of the fins 3a to 3c respectively, as well as in a region between the fins 3a and 3b, and in a region between the fins 3b and 3c. The silicide layers 10 are respectively formed on exposed surfaces of the epitaxial layer 9. The gate silicide layer 12 is formed on the upper surface of the gate electrode 4. Here, to "dispose substantially parallel to each other" indicates to dispose either in parallel or in subparallel, and is used to mean that thus-disposed items do not have to be strictly parallel to each other. Note that each silicide layer 10 is shown in simplified form in FIG. 1.

As shown in FIG. 1, an x axis is taken in the direction parallel to both the upper surface of the semiconductor substrate 2 and the longitudinal direction of the gate electrode 4. A y axis is taken in the direction parallel to the upper surface of the semiconductor substrate 2 and perpendicular to the x axis, while a z axis is taken in the direction perpendicular to the upper surface of the semiconductor substrate 2. Hereinbelow, description will be given while a rectangular coordinate system defined by these axes x, y and z is applied to all the drawings.

As the semiconductor substrate 2, a bulk Si substrate or a silicon-on-insulator (SOI) substrate that includes a buried oxide layer is used, for example.

The fins 3a to 3c are made of, for example, monocrystalline Si, and each have a thickness of approximately two thirds of the gate length, that is, have a thickness of 5 to 30 nm, for example.

The gate electrode 4 is made of, for example, polycrystal Si or polycrystal SiGe including conductive impurities. As the conductive impurities, p-type impurity ions such as B or BF2 are used for a p-type transistor while n-type impurity ions such as As or P are used for an n-type transistor. Alternatively, the gate electrode 4 may also be a metal gate electrode made of W, Ta, Ti, Hf, Zr, Ru, Pt, Ir, Mo, Al or the like, or made of one of compounds thereof.

Each gate insulating film 7 is, for example, a SiO2 film, which is formed on surfaces of the fins 3 by an oxidation treatment.

A first cap layer 20 made of an insulating material such as SiO2 is formed between the gate electrode 4 and the upper surface of each of the fins 3a to 3c.

On side surfaces of the gate electrode 4, gate sidewalls 6 are formed. Each gate sidewall 6 may have a single-layer structure that consists of an insulating material such as SiN, or may have a double-layer structure that consists of multiple insulating materials such as SiN, SiO2 and tetraethoxysilane (TEOS). Moreover, each gate sidewall 6 may have a multilayer structure consisting of more than two layers.

The epitaxial layers 9 are formed by epitaxial growth of Si-based crystals, such as crystals of Si, SiGe or SiC, on surfaces of the fins 3a to 3c that serve as epitaxial bases for the epitaxial growth.

A growth control region 8 is formed in each of side surfaces, parallel to the thickness direction, of the fins 3a to 3c, as well as on each of side surfaces, opposite to the side surfaces facing the fin 3b, of the fins 3a and 3c which are located at both ends of the line of the three fins. The growth control regions 8 are where the epitaxial growth of the crystals is controlled, and formed by, for example, an ion implantation method. Specifically, elements capable of deforming lattices of Si-based crystals that constitute the fins 3a to 3c are implanted into the fins 3a to 3c, so that the growth control regions 8 are formed, for example. As such elements, C or Ge can be used. Note that an aforementioned growth control region 8 is also formed in a small region of each of side surfaces, facing the fin 3b, of the fins 3a and 3c, as well as on a small region of each of side surfaces, respectively facing the fins 3a and 3c, of the fin 3b. These small regions extend from the side edges, in the longitudinal direction, of the fins 3a to 3c.

In this embodiment, no epitaxial layer 9 is formed on the growth control regions 8. Accordingly, in regions on the side surfaces, opposite to the side surfaces facing the fin 3b, of the fins 3a and 3c, the epitaxial layers 9 have a thickness of 0. On the other hand, the regions between the fins 3a to 3c are almost completely filled with the epitaxial layers 9. This means that the epitaxial layers 9 have a thickness equivalent to half of a distance between each adjacent two fins, on the side surfaces, facing the fin 3b, of the fins 3a and 3c, as well as on the side surfaces, respectively facing the fins 3a and 3c, of the fin 3b (excluding the small regions in which the growth control regions 8 are formed).

Incidentally, in a case where the growth control regions 8 are formed by implanting C into Si-based crystals, Carbon concentration in the growth control regions 8 should preferably be 1 to 2 atomic %. This is because the C concentration lower than 1 atomic % is less effective at controlling epitaxial growth of crystals, and because the C concentration higher than 2 atomic % may possibly cause crystal defect in the growth control regions 8.

The source/drain regions 5 and the extension regions 5a thereof are formed by, for example, an ion implantation method. Specifically, conductive impurities are implanted into the fins 3a to 3c and the epitaxial layers 9, so that the source/drain regions 5 and the extension regions 5a thereof are formed, for example. As the conductive impurities, p-type impurity ions such as B or BF2 are used for a p-type transistor while n-type impurity ions such as As or P are used for an n-type transistor.

The silicide layers 10 and the gate silicide layer 12 are made of a compound of Si and a metal such as Ni, Pt, Co, Er, Y, Yb, Ti, Pd, NiPt, CoNi or the like, and have a thickness of 5 to 30 nm, for example. The silicide layers 10 are respectively formed on the exposed surfaces of the epitaxial layers 9 and the fins 3a to 3c while the gate silicide layer 12 is formed on the upper surface of the gate electrode 4.

(Manufacturing Method of Semiconductor Device)

FIGS. 4 to 12 are diagrams for illustrating a manufacturing method of the semiconductor device according to the first embodiment of the present invention.

Figure 4:
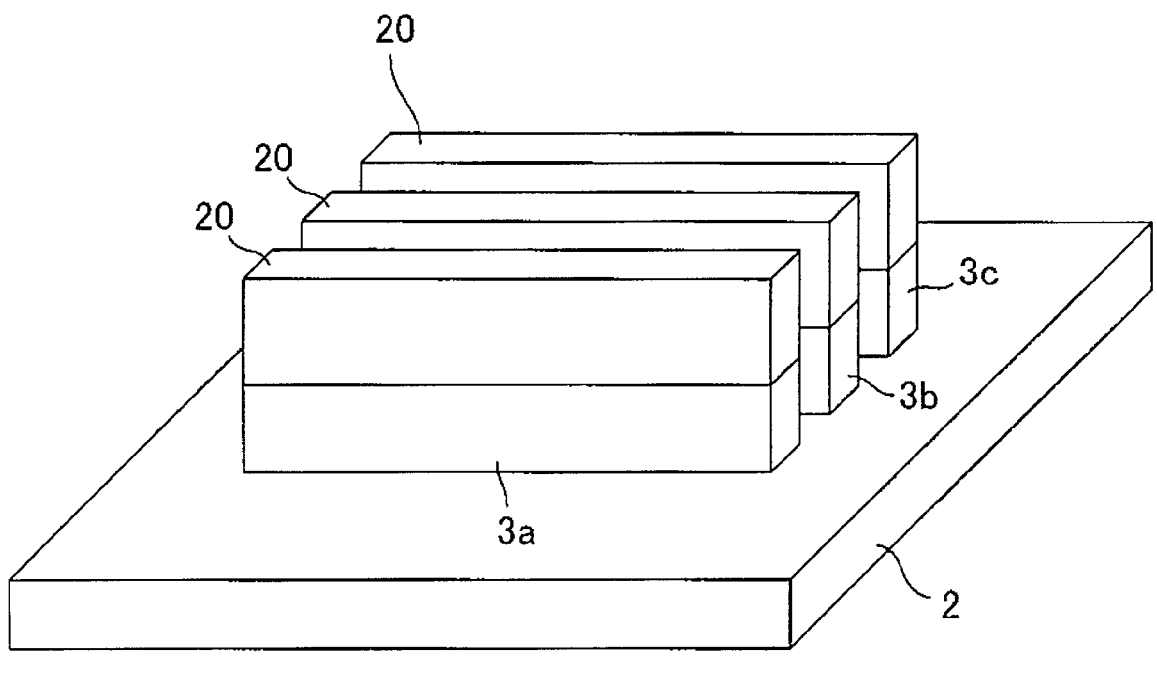
FIGS. 4 to 12 are diagrams for illustrating a manufacturing method of the semiconductor device according to the first embodiment of the present invention.

Firstly, as shown in FIG. 4, the fins 3a to 3c and the first cap layers 20 are formed on the semiconductor substrate 2.

The fins 3a to 3c and the first cap layers 20 are formed as follows. Firstly, a precursor film for the fins 3a to 3c, such as a monocrystalline Si film, and a precursor film for the first cap layers 20, which is made of SiN, SiO2 or the like, are sequentially stacked on the semiconductor substrate 2 by using a chemical vapor deposition (CVD) method or the like so as to provide a stacking structure. Thereafter, these precursor films are patterned by using, for example, a photolithography technique and a reactive ion etching (RIE) method.

Figure 5:
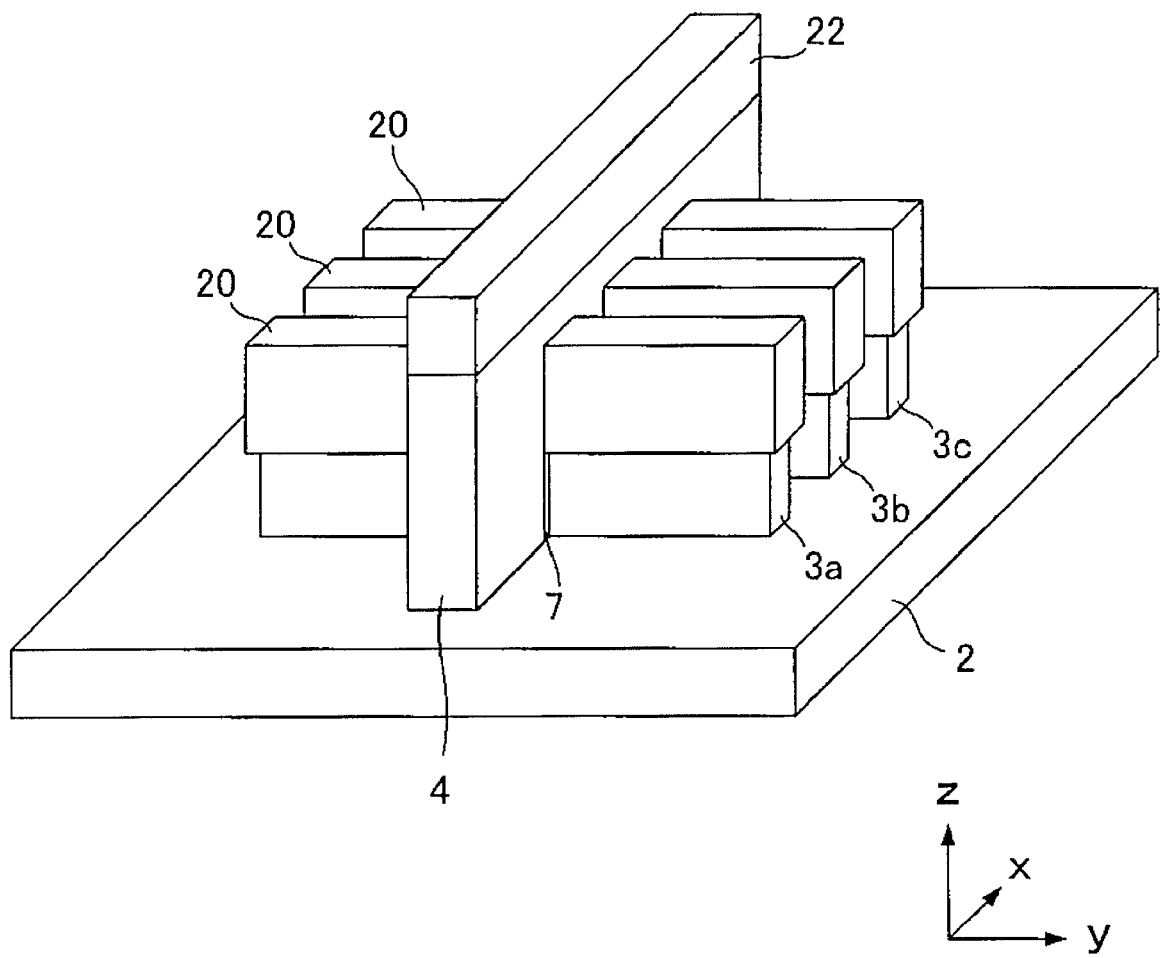

Then, the gate electrode 4, a second cap layer 22 and the gate insulating films 7 are formed as shown in FIG. 5.

The gate electrode 4, the second cap layer 22 and the gate insulating films 7 are formed through the following processes. Firstly, an oxide film is formed on each surface of the fins 3a to 3c by an oxidation treatment. Then, a precursor film for the gate electrode 4, such as a polycrystal Si film, is stacked on the semiconductor substrate 2 by using a CVD method or the like, and thereafter the precursor film is planarized by a chemical mechanical polishing (CMP) method or the like. Then, on the thus-planarized precursor film for the gate electrode 4, a precursor film for the second cap layer 22, which is made of SiN, SiO2 or the like, is stacked. Thereafter, the precursor film for the gate electrode 4, the precursor film for the second cap layer 22 and the oxide films on the respective fins 3a to 3c are patterned by using, for example, a photolithography technique and an RIE method, and thereby processed into the gate electrode 4, the second cap layer 22 and the gate insulating films 7, respectively. Note that the process of planarizing the precursor film for the gate electrode 4 may be omitted.

Figure 6:
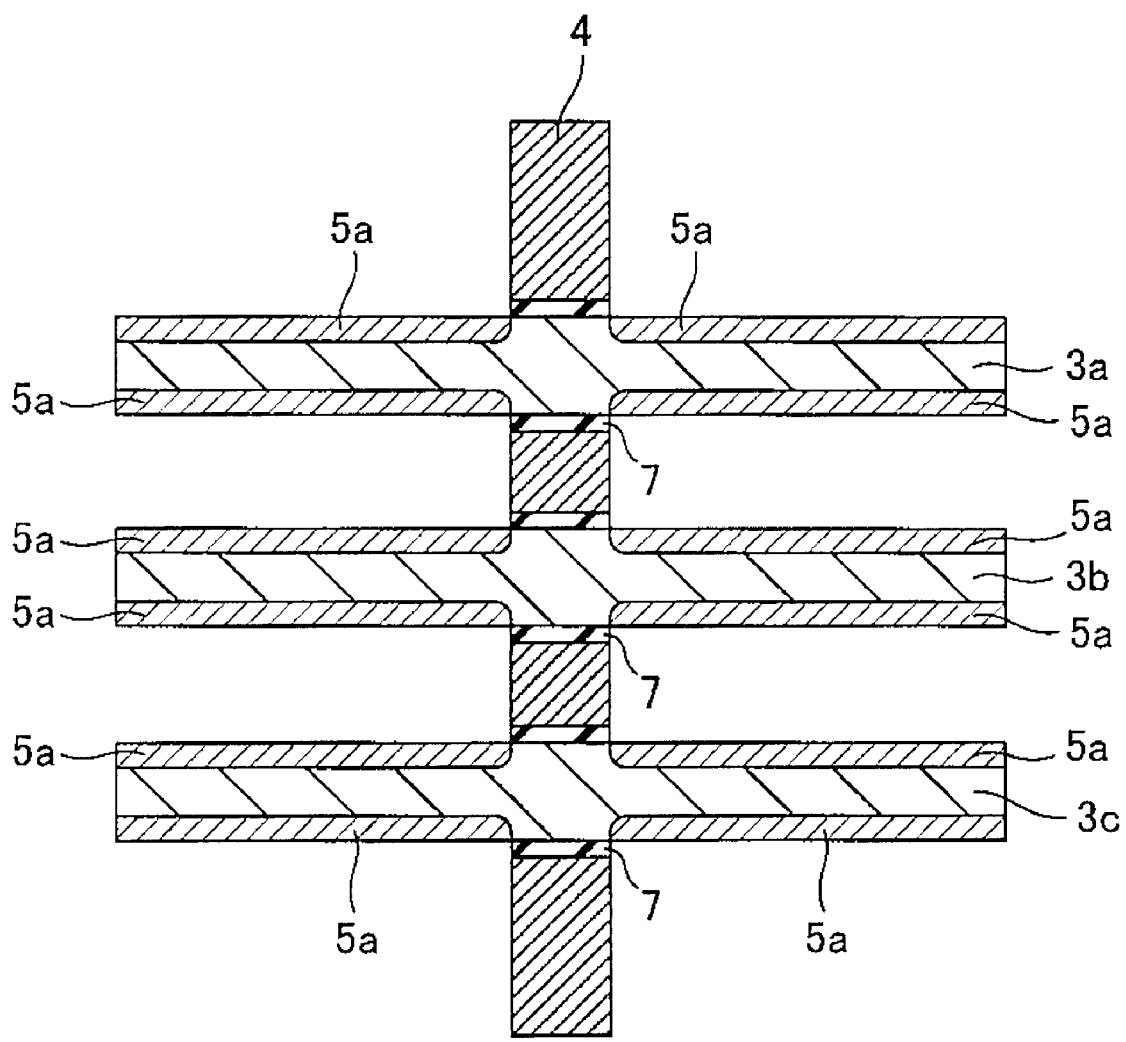
Figure 6:
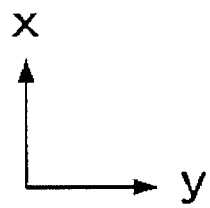

Next, as shown in FIG. 6, the extension regions 5a of the source/drain regions 5 are formed by an ion implantation method. Specifically, conductive impurities are implanted into the both side surfaces, in the longitudinal direction, of the respective fins 3a to 3c, so that the extension regions 5a are formed. In this event, the implantation is performed in a direction inclined at a predetermined angle relative to the vertical direction. Note that FIG. 6 shows a cross section corresponding to the cross sections shown in FIGS. 2A and 2B.

Here, the predetermined angle is set to an angle at which the conductive impurities implanted into each fin can reach regions where the extension regions 5a are to be formed, without being blocked by the adjacent fin. Thereafter, the thus-formed extension regions 5a are annealed, so that the conductive impurities therein are activated.

Next, an insulating film 23 that is a precursor film for the gate sidewalls 6 is stacked on the semiconductor substrate 2 by using a CVD method, or the like. Thereafter, the insulating film 23 is etched so as to be processed into the gate sidewalls 6.

Figure 7:
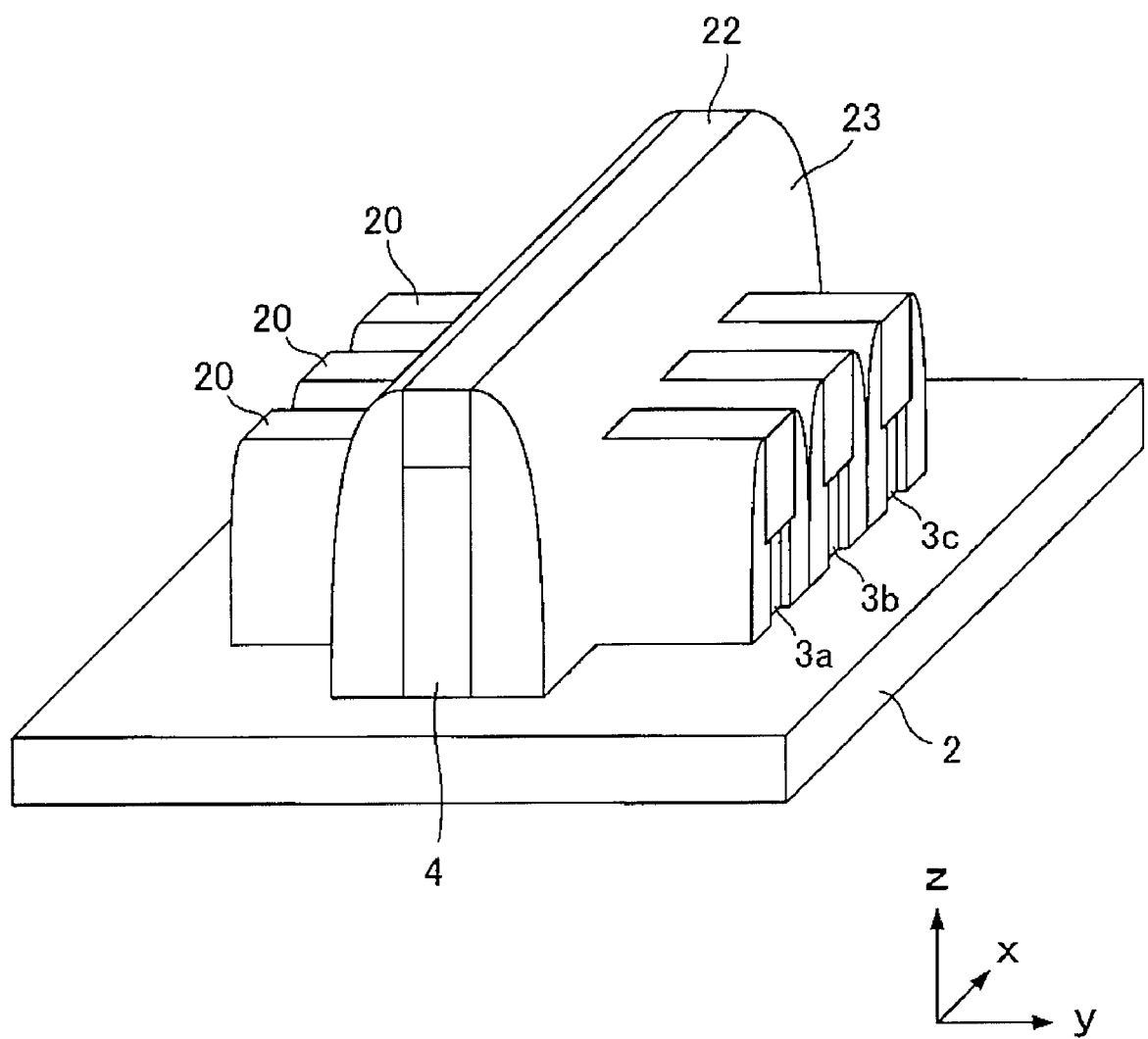

FIG. 7 shows a state in the middle of the process of etching the insulating film 23. The insulating film 23 remains on the side surfaces of the fins 3a to 3c and the first cap layers 20, as well as on the side surfaces of the gate electrode 4 and the second cap layer 22. However, the insulating film 23 on the side surfaces of the gate electrode 4 and the second cap layer 22 is higher and thicker than that on the side surfaces of the fins 3a to 3c and the first cap layers 20, since the gate electrode 4 and the second cap layer 22 are higher than the fins 3a to 3c and the first cap layers 20.

Figure 8:
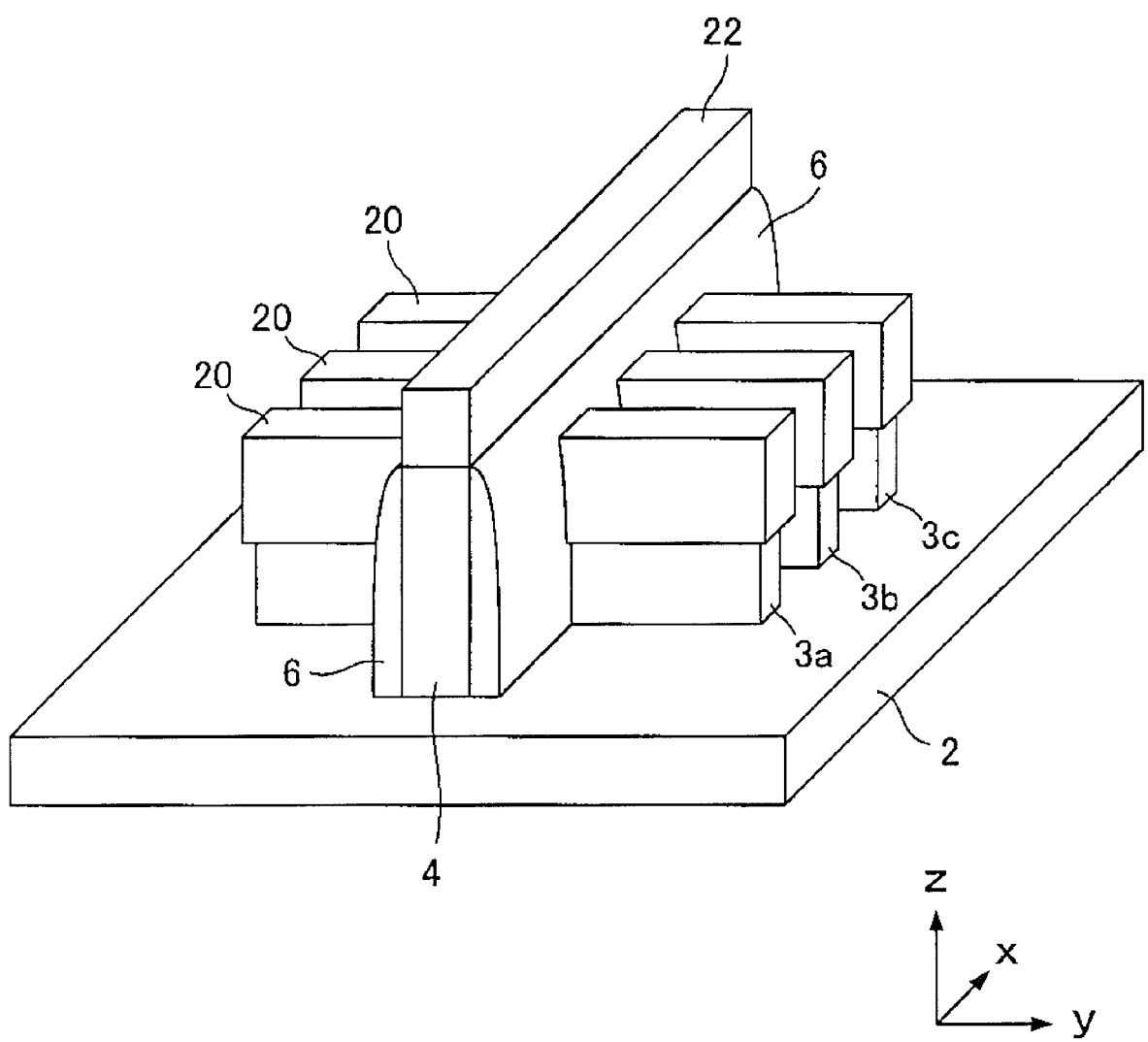

FIG. 8 shows a state after the insulating film 23 is etched further than the state shown in FIG. 7. As shown in FIG. 8, the insulating film 23 is processed into the gate sidewalls 6 arranged on the side surfaces of the gate electrode 4 without remaining on the side surfaces of the fins 3a to 3c. Here, the first and second cap layers 20 and 22 should preferably remain instead of being removed off. Accordingly, the first and second cap layers 20 and 22 should preferably either have a sufficient thickness, or be made of a material different from the gate sidewalls 6.

Figure 9A:
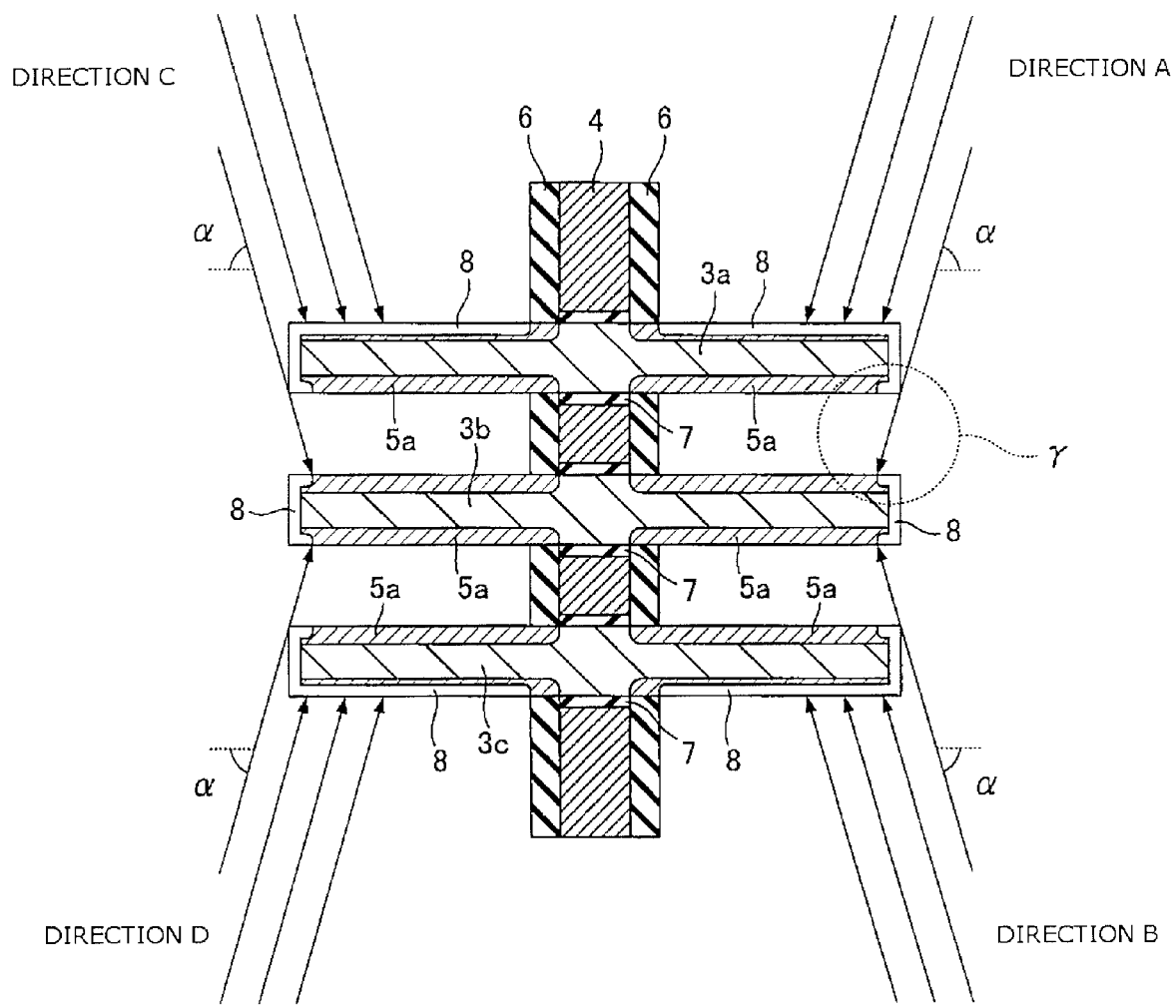
Figure 9B:
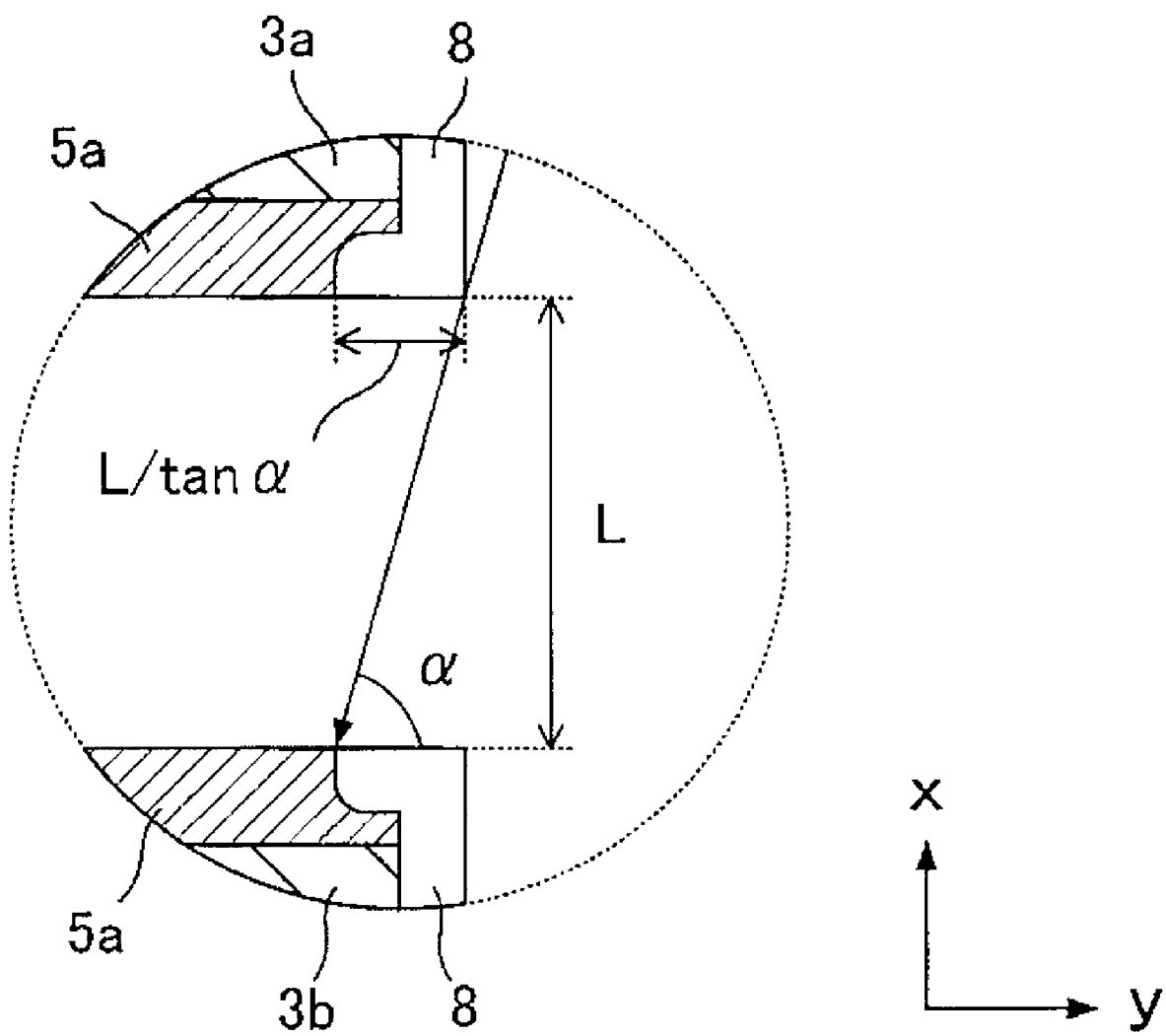
Figure 9C:
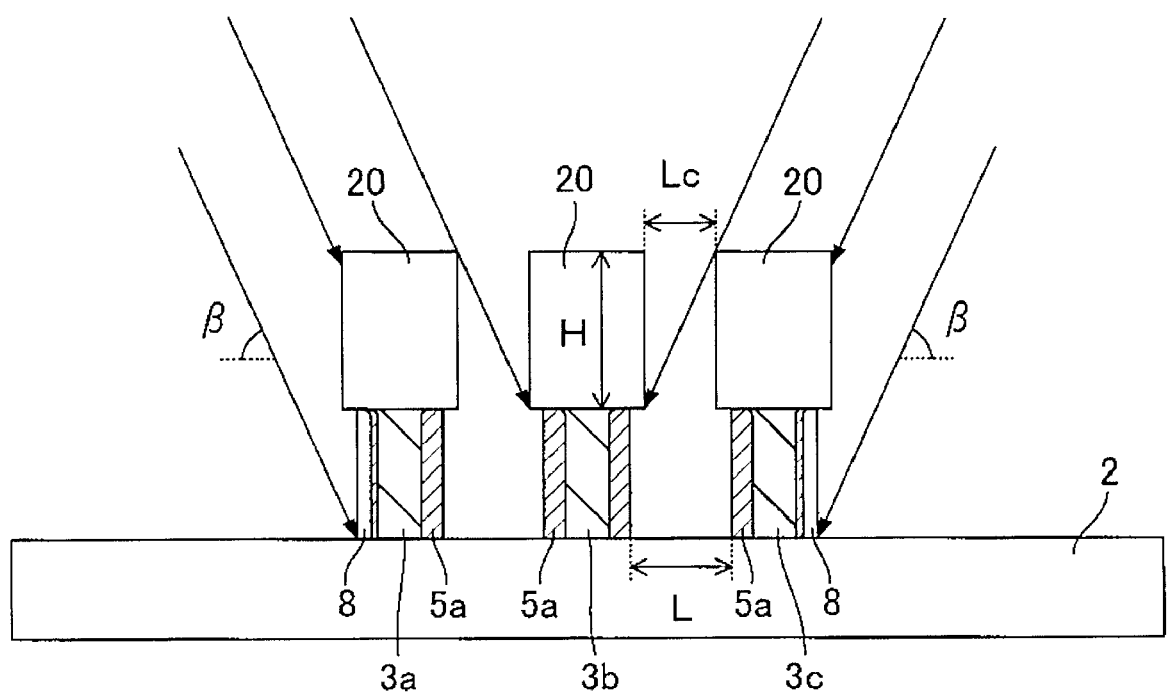

Next, as shown in FIGS. 9A to 9C, the growth control regions 8 are formed by an ion implantation method. For example, impurities of C or the like are implanted into surfaces of the fins 3a to 3c in four directions A to D, so that the growth control regions 8 are formed. FIG. 9A shows a cross section corresponding to the cross sections shown in FIGS. 2A and 2B. FIG. 9B is an enlarged view of the region enclosed by the circle γ in FIG. 9. FIG. 9C shows a cross section corresponding to the cross sections shown in FIGS. 3A and 3B.

Each of the directions in which the above impurities are implanted is inclined at α relative to a direction parallel to the y axis, as viewed in a direction parallel to the x axis as shown in FIGS. 9A and 9B, and is also inclined at β relative to a direction parallel to the x axis, as viewed in a direction parallel to the y axis as shown in FIG. 9C. Note that implant concentration of the above impurities should preferably be $1.0 \times 10^{17}$ ions/cm3 to $1.0 \times 10^{21}$ ions/cm3.

After the impurities are implanted into the surfaces of the fins 3a to 3c in the directions inclined at the aforementioned angles, the growth control region 8 is formed in each of the side surfaces, parallel to the thickness direction, of the fins 3a to 3c, as well as in each of the side surfaces, opposite to the side surfaces facing the fin 3b, of the fins 3a and 3c.

Moreover, the growth control region 8 is also formed in the small region of each of the side surfaces, facing the fin 3b, of the fins 3a and 3c, as well as in the small region of each of the side surfaces, respectively facing the fins 3a and 3c, of the fin 3b. Here, these small regions, in which the growth control regions 8 are formed, extend from the side edges, in the longitudinal direction, of the fins 3a to 3c to points L/tan α distant from the edges, where L is the distance between each adjacent two of the fins 3a and 3c. The smaller these regions are better. Accordingly, the implant angle α of the impurities should preferably be as large as possible.

Moreover, the impurities should preferable be implanted into the surfaces of the fins 3a to 3c in the directions inclined at the angle β relative to the direction parallel to the x axis, as viewed in the direction parallel to the y axis as shown in FIG. 9C. Here, the angle β is set to an angle at which no growth control region 8 is formed in the side surfaces, facing the fin 3b, of the fins 3a and 3c, as well as in the side surfaces, respectively facing the fins 3a and 3c, of the fin 3b, when viewed in the direction parallel to the y axis. Specifically, the implant angle β of the impurities should preferably satisfy the formula: $\tan \beta \leq H/Lc$, where Lc is a distance between each adjacent two of the first cap layers 20, and H is the height of each first cap layer 20.

Incidentally, suppose the case where the first cap layers 20 on the respective fins 3a to 3c are removed off before the impurities are implanted into the surfaces of the fins 3a to 3c. In this case, the growth control regions 8 are formed also in small regions extending from the upper edges of the fins 3a to 3c. Specifically, these small regions are located in the side surfaces, facing the fin 3b, of the fins 3a and 3c, as well as in the side surfaces, respectively facing the fins 3a and 3c, of the fin 3b. Here, these small regions, in which the growth control regions 8 are formed, extend from the upper edges of the fins 3a to 3c to points L·tan β distant from the upper edges, where L is a distance between each adjacent two of the fins 3a and 3c. The smaller these regions are better. Accordingly, the implant angle β of the impurities should preferably be as small as possible.

Here, the crystal lattices in the growth control regions 8 are deformed by the implanted impurities of C or the like. Accordingly, the growth control regions 8 are less likely to serve as bases for the epitaxial crystal growth.

Figure 10:
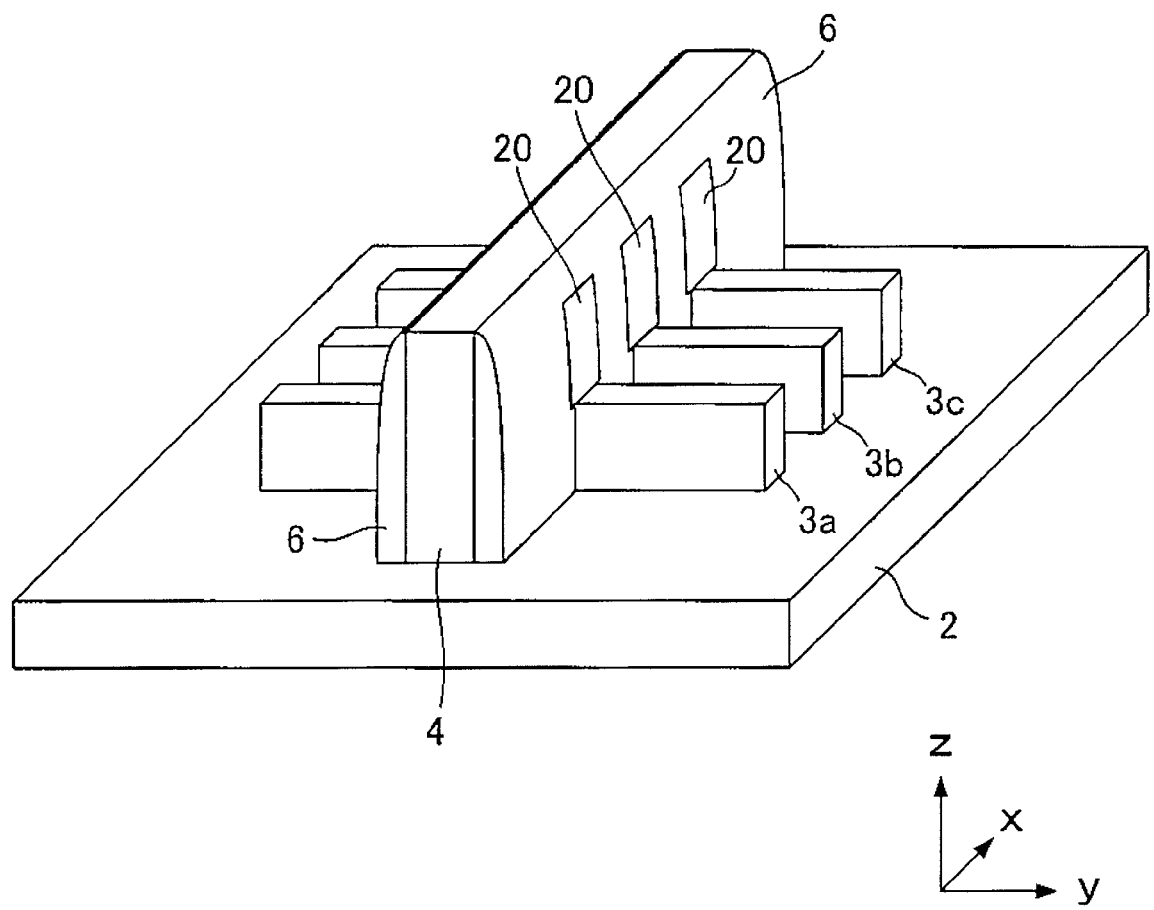

Next, as shown in FIG. 10, the second cap layer 22, and exposed portions of the first cap layers 20 on the respective fins 3a to 3c are removed off by wet etching using dilute hydrofluoric acid or the like. Note that the second cap layer 22 may not be removed off. In addition, the exposed portions of the first cap layers 22 may not be removed off, neither. However in this case, the epitaxial layers 9 are not formed on the respective fins 3a to 3c in the subsequent process.

Figure 11A:
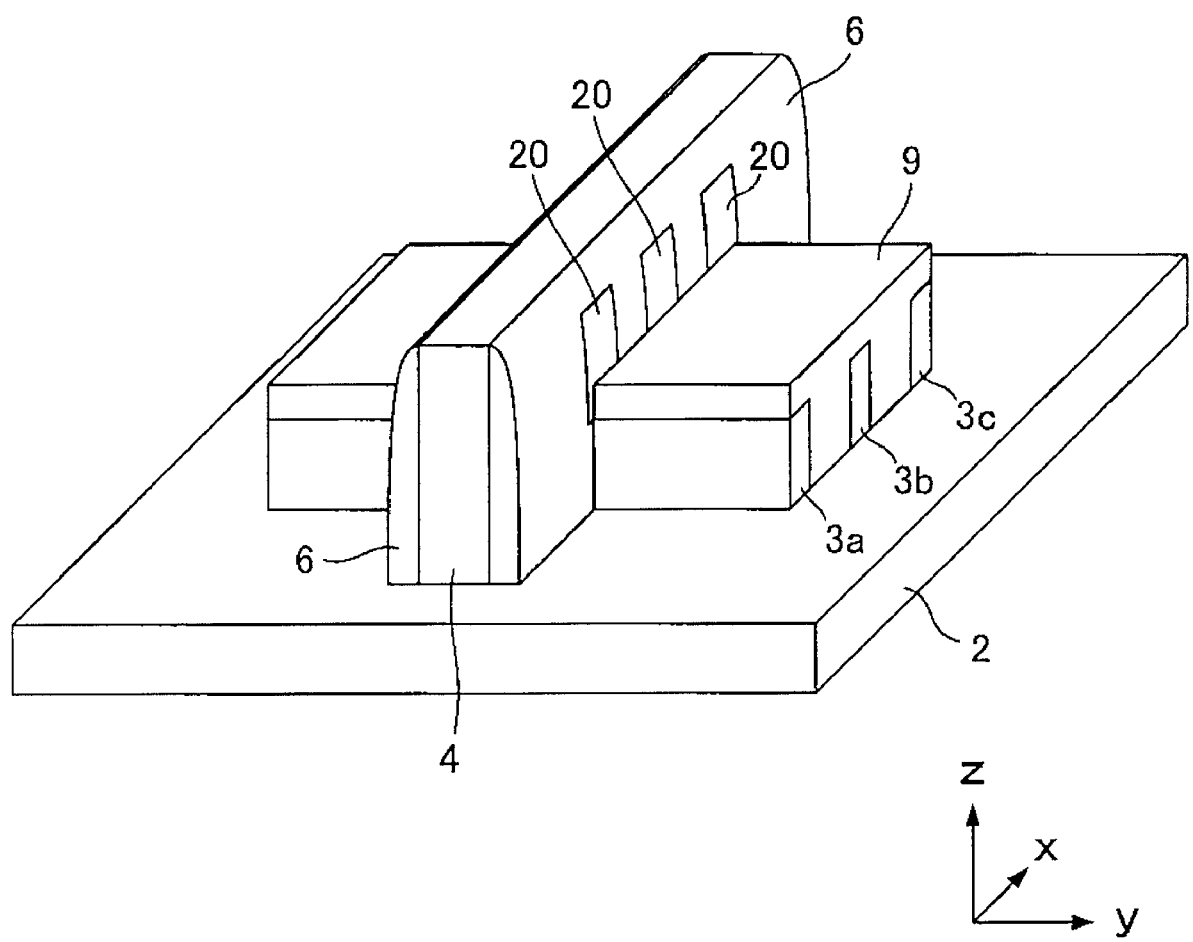
Figure 11B:
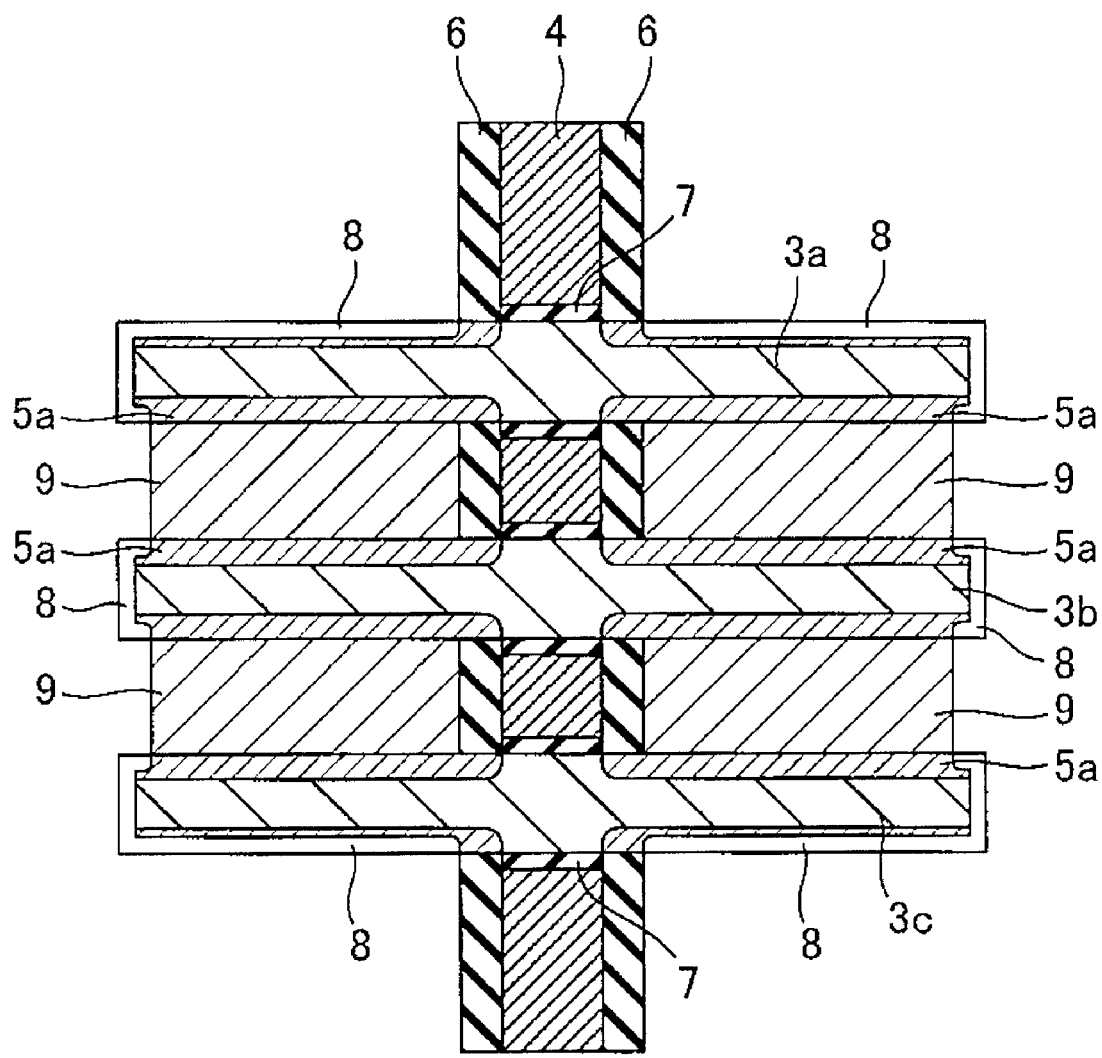
Figure 11C:
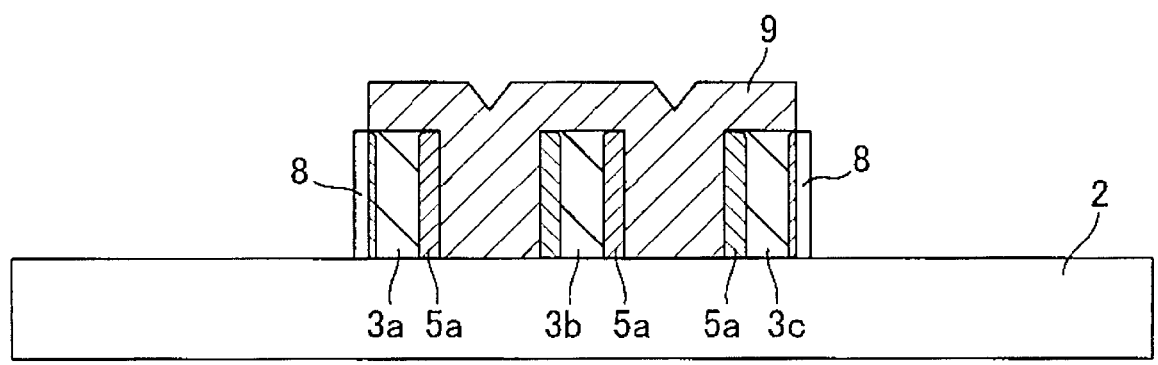

Next, as shown in FIGS. 11A to 11C, the crystals in the fins 3a to 3c are epitaxially grown to form the epitaxial layers 9 on the exposed surfaces of the fins 3a to 3c that serve as epitaxial bases. Here, FIG. 11B shows a cross section corresponding to the cross sections shown in FIGS. 2A and 2B, while FIG. 11C shows a cross section corresponding to the cross sections shown in FIGS. 3A and 3B. Note that the epitaxial layer 9 is shown in simplified form in FIG. 11A.

In this process, in the surfaces of the fins 3a to 3c, the crystals in the regions in which the growth control regions 8 are formed grow at a lower speed than the crystals in the regions in which no growth control region 8 is formed, since the former regions is different from the latter regions in terms of lattice constant. Generally, in a selective epitaxial growth process, an epitaxially grown film is etched during being grown. Accordingly, if conditions of the growth control regions 8 are controlled so that etching speed can be higher than epitaxial growth speed therein, the epitaxial layers 9 are formed only on the regions, in which no growth control region 8 is formed, of the surfaces of the fins 3a to 3c. Note that the epitaxial layer 9 may be also formed on the upper surface of the gate electrode 4.

Specifically, the epitaxial growth of the above crystals is carried out in a chemical vapor deposition chamber under the following conditions. For example, in the case where the epitaxial layers 9 are formed by using Si crystals, the Si crystals are grown by vapor phase epitaxy in a hydrogen gas atmosphere or the like at a temperature of 700° C. to 850° C., while monosilane (SiH4), dichlorosilane (SiH2Cl2), trichlorosilane (SiHCl3) or the like is used as the Si material.

Alternatively, in the case where the epitaxial layers 9 are formed by using SiGe crystals, germanium hydride (GeH4) or the like is added to the above gases, as the Ge material. In the case where the epitaxial layers 9 are formed by using SiC crystals, acetylene (C2H2) or the like is added to the above gases, as the C material.

Figure 12:
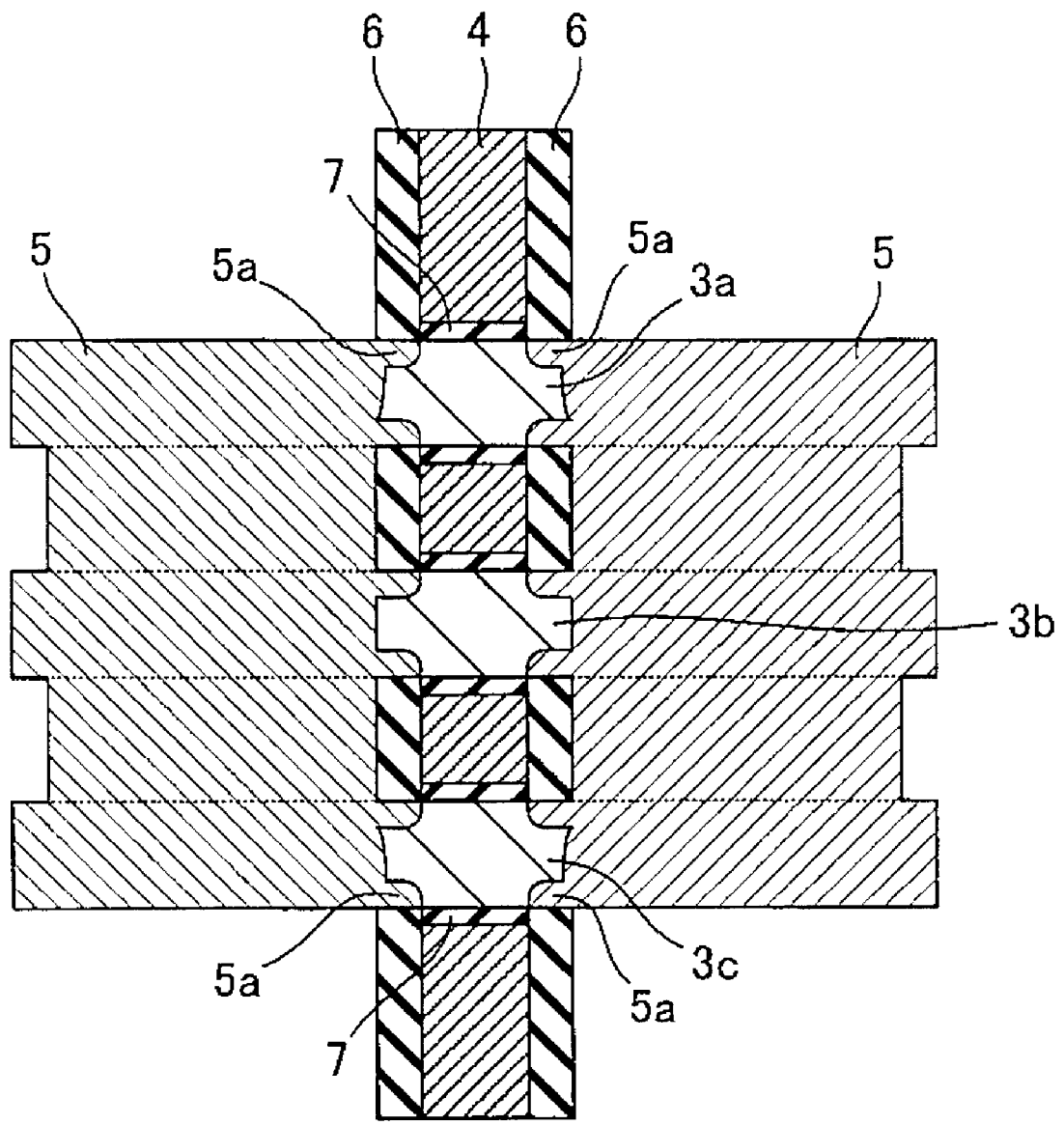

Then, in the case where the second cap layer 22 remains on the gate electrode 4, the second cap layer 22 is removed off by wet etching. Subsequently, as shown in FIG. 12, the conductive impurities are implanted into the fins 3a to 3c and the epitaxial layers 9 by an ion implantation method, and thereby the source/drain regions 5 are formed. Note that FIG. 12 shows a cross section corresponding to the cross sections shown in FIGS. 2A and 2B. Thereafter, the thus-formed source/drain regions 5 are annealed, so that the conductive impurities therein are activated.

After that, the silicide layers 10 are respectively formed on the exposed surfaces of the epitaxial layers 9 and the fins 3a to 3c, while the gate silicide layer 12 is formed on the upper surface of the gate electrode 4. Thereby, the semiconductor device 1 shown in FIGS. 1, 2A, 2B, 3A and 3B is provided.

Here, the silicide layers 10 and the gate silicide layer 12 are formed as follows. Firstly, a metal film made of Ni or the like is stacked on the semiconductor substrate 2 by sputtering so as to cover the exposed surfaces of the epitaxial layers 9 and the fins 3a to 3c as well as the upper surface of the gate electrode 4. Thereafter, the exposed surfaces of the epitaxial layers 9 and the fins 3a to 3c as well as the upper surface of the gate electrode 4 are silicided with the component of the metal film through rapid thermal annealing (RTA) at a temperature of 400° C. to 500° C. In this process, the silicidation reaction does not spread over the entire bodies of the fins 3a to 3c. After this process, unreacted portions of the metal film are removed off by etching with the mixture solution of sulfuric acid and hydrogen peroxide solution.

EFFECT OF FIRST EMBODIMENT

According to the first embodiment of the present invention, the epitaxial layers 9 are partially formed on the surfaces of the fins 3a to 3c, thus preventing the bodies of the fins 3a to 3c from being entirely silicided. Moreover, the growth control region 8 is formed in each of the side surfaces, parallel to the thickness direction, of the fins 3a to 3c, as well as in each of the side surfaces, opposite to the side surfaces facing the fin 3b, of the fins 3a and 3c, so that formation of the epitaxial layers 9 is controlled in the growth control region 8. This prevents the semiconductor device 1 from coming in contact with other devices adjacent thereto, thus preventing short circuit between the devices, and the like.

SECOND EMBODIMENT

A second embodiment of the present invention is different from the first embodiment in that growth control films 11 are used in place of the growth control region 8 in the process of forming the epitaxial layers 9. Accordingly, description of similar points to the first embodiment, such as configurations of the components other than the growth control films 11 will be omitted.

(Manufacturing Method of Semiconductor Device)

FIGS. 13 to 16 are diagrams for illustrating a manufacturing method of a semiconductor device according to the second embodiment of the present invention.

Firstly, the processes until processing the insulating film 23 shown in FIG. 8 in the first embodiment into the gate sidewalls 6 is performed.

Figure 13:
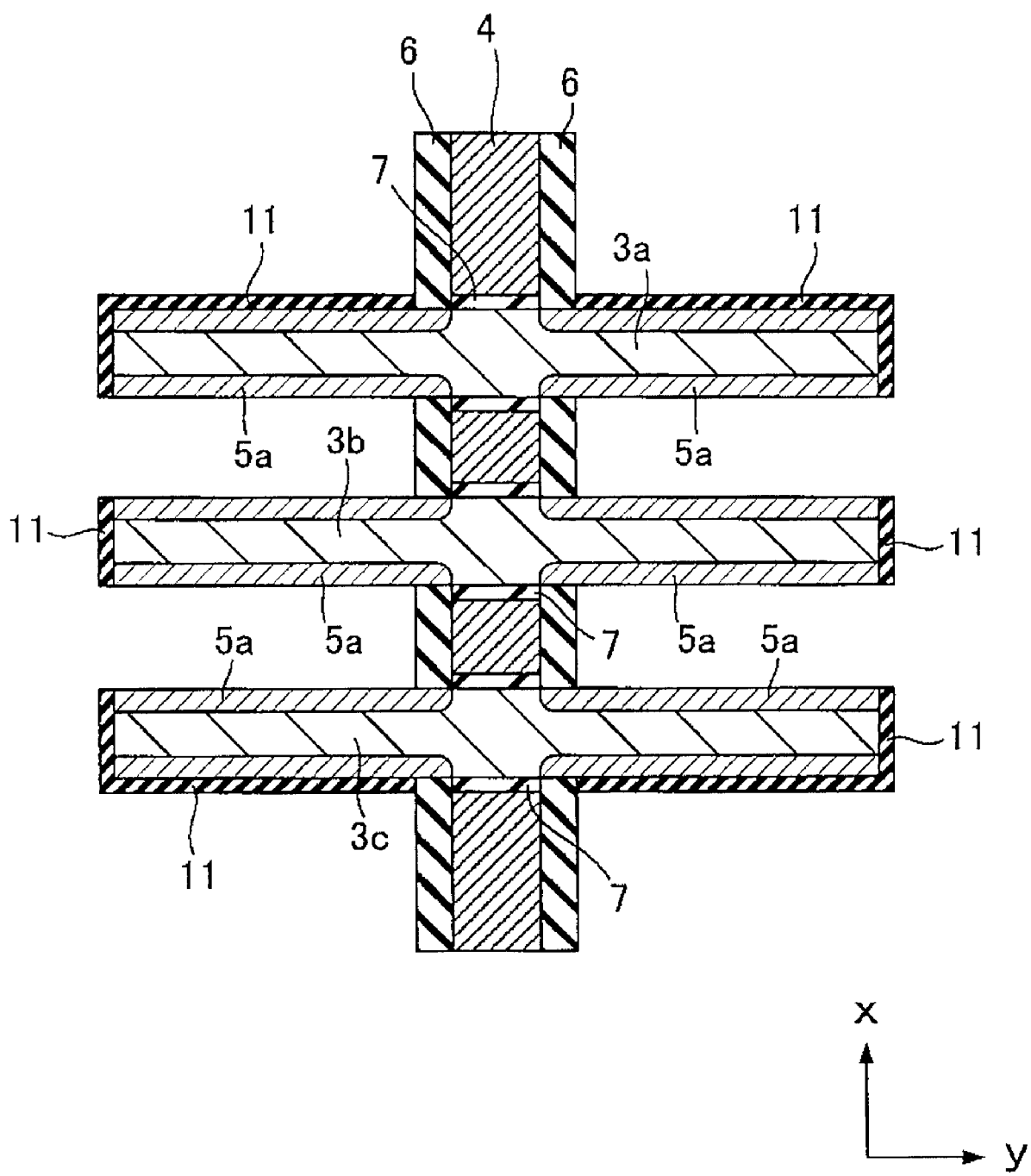
FIGS. 13 to 16 are diagrams for illustrating a manufacturing method of a semiconductor device according to the second embodiment of the present invention.

Next, as shown in FIG. 13, the growth control film 11 made of SiN, SiO2 or the like are formed on each of the side surfaces, parallel to the thickness direction, of the fins 3a to 3c, as well as on each of the side surfaces, opposite to the side surfaces facing the fin 3b, of the fins 3a and 3c. Note that, in the case where the first cap layers 20 are removed off by etching in a process after the growth control films 11 are formed, the growth control films 11 should preferably be made of a material different from the first cap layers 20 so as not to be removed off together with the first cap layers 20 in the process.

Specifically, the growth control films 11 are formed through the following processes. Firstly, the growth control film 11 is stacked on each of surface of the fins 3a to 3c by a CVD method. In this process, a gas for the CVD is sufficiently supplied neither to the region between the fins 3a and 3b, nor to the region between the fins 3b and 3c. Accordingly, the growth control films 11 formed in the above regions become thinner than those on the side surfaces, parallel to the thickness direction, of the fins 3a to 3c, as well as on the side surfaces, opposite to the side surfaces facing the fin 3b, of the fins 3a and 3c.

Thereafter, the growth control films 11 are wet-etched under conditions in which just the thin growth control films 11 thus formed in the region between the fins 3a and 3b, and in the region between the fins 3b and 3c are exactly removed off. In this process, the growth control films 11 formed on the side surfaces, parallel to the thickness direction, of the fins 3a to 3c, as well as on the side surfaces, opposite to the side surfaces facing the fin 3b, of the fins 3a and 3c are thicker than those in the region between the fins 3a and 3b, and in the region between the fins 3b and 3c. Accordingly, these thick growth control films 11 remain instead of being removed off as shown in FIG. 13.

As the etchant used in the above wet etching, hot phosphoric acid is used when the growth control films 11 are SiN films, or dilute hydrofluoric acid when the growth control films 11 are SiO2 films.

Figure 14:
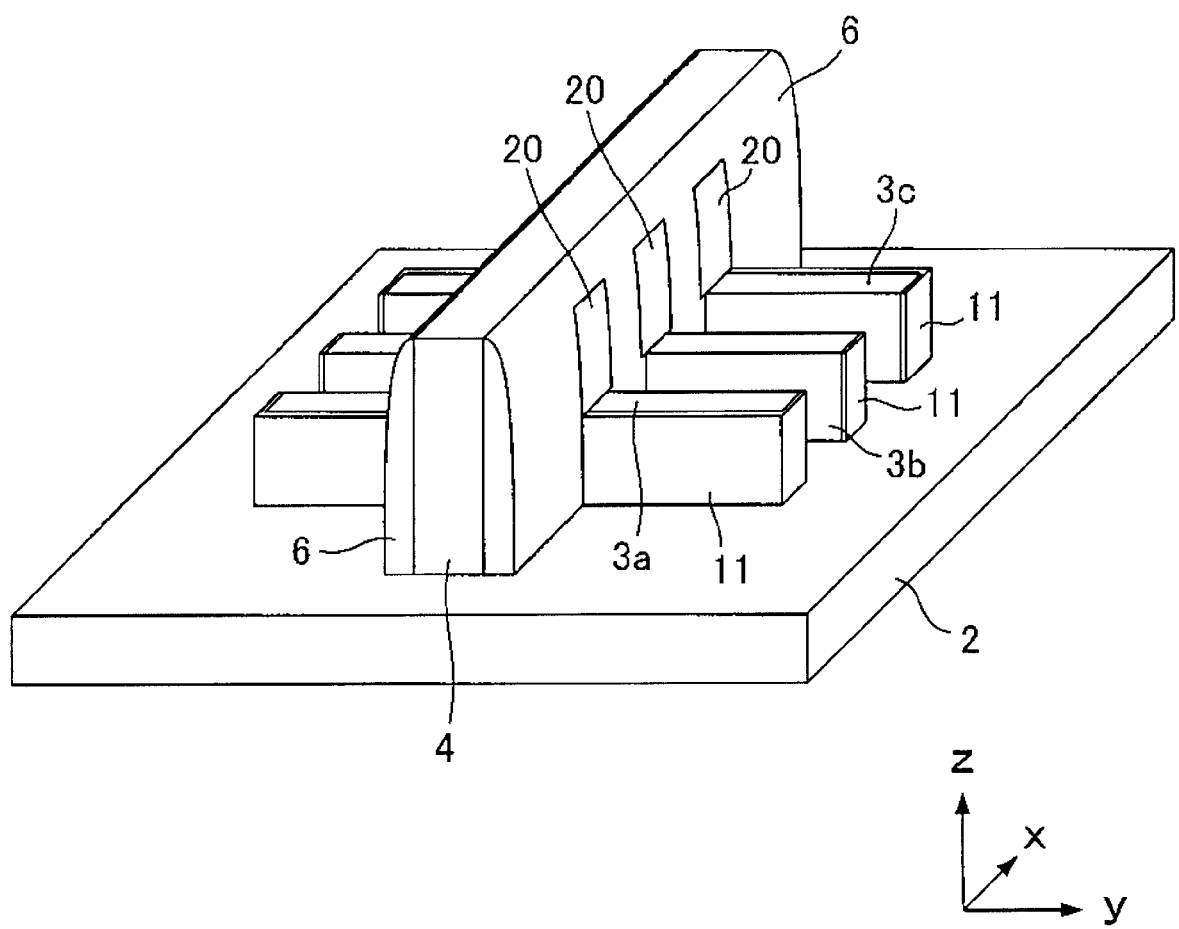

Then, as shown in FIG. 14, exposed portions of the first cap layers 20 on the respective fins 3a to 3c are removed off by wet etching with dilute hydrofluoric acid or the like.

Figure 15:
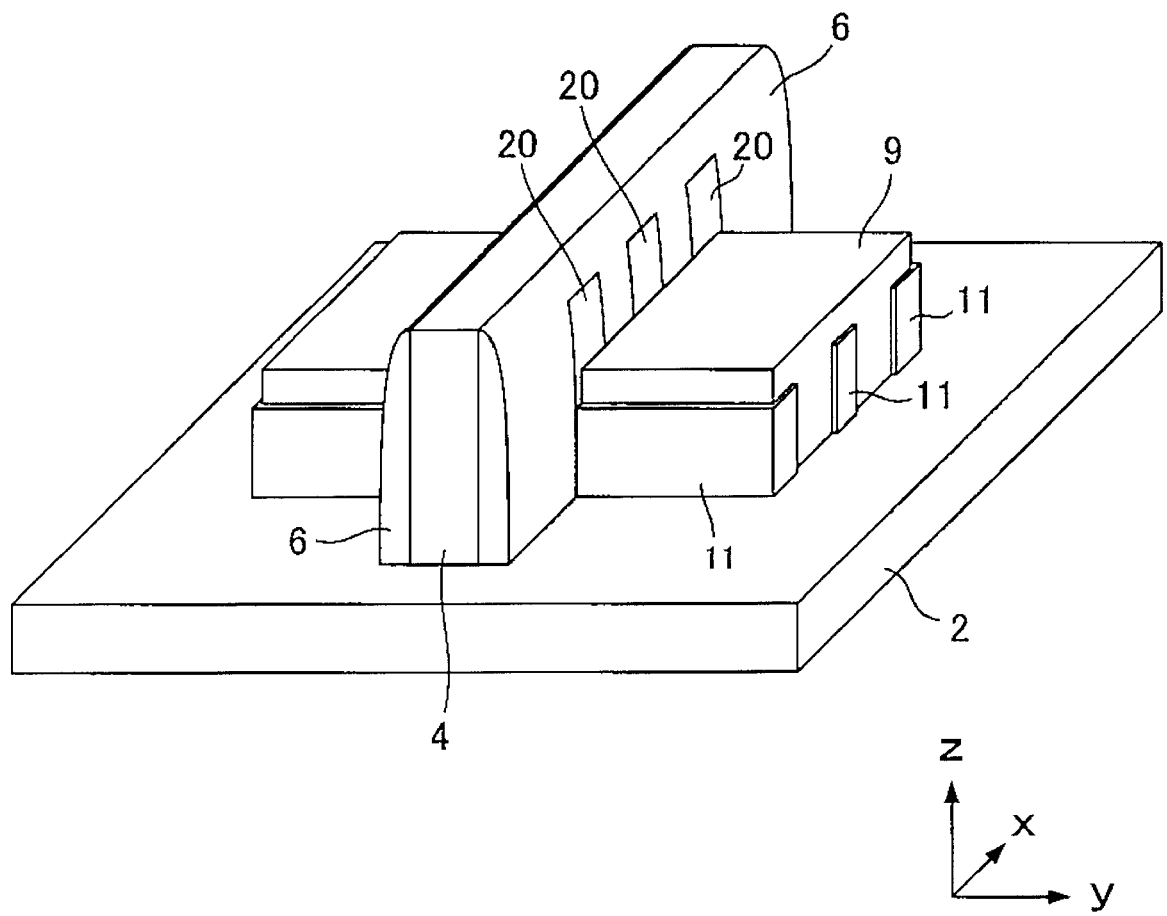

Next, as shown in FIG. 15, the crystals in the fins 3a to 3c are epitaxially grown to form the epitaxial layers 9 on the exposed surfaces of the fins 3a to 3c that serve as epitaxial bases. In this process, the crystals are not grown on surfaces of the growth control films 11, so that the epitaxial layers 9 can be formed only on regions, in which the growth control films 11 are not formed, in the surfaces of the fins 3a to 3c.

On the growth control films 11, no epitaxial layer 9 is formed. Accordingly, in regions on the side surfaces, opposite to the side surfaces facing the fin 3b, of the fins 3a and 3c, the epitaxial layers 9 have a thickness of 0. On the other hand, the regions between the fins 3a to 3c are almost completely filled with the epitaxial layers 9. This means that the epitaxial layers 9 have a thickness equivalent to half of a distance between each adjacent two fins, on the side surfaces, facing the fin 3b, of the fins 3a and 3c, as well as on the side surfaces, respectively facing the fins 3a and 3c, of the fin 3b.

Figure 16:
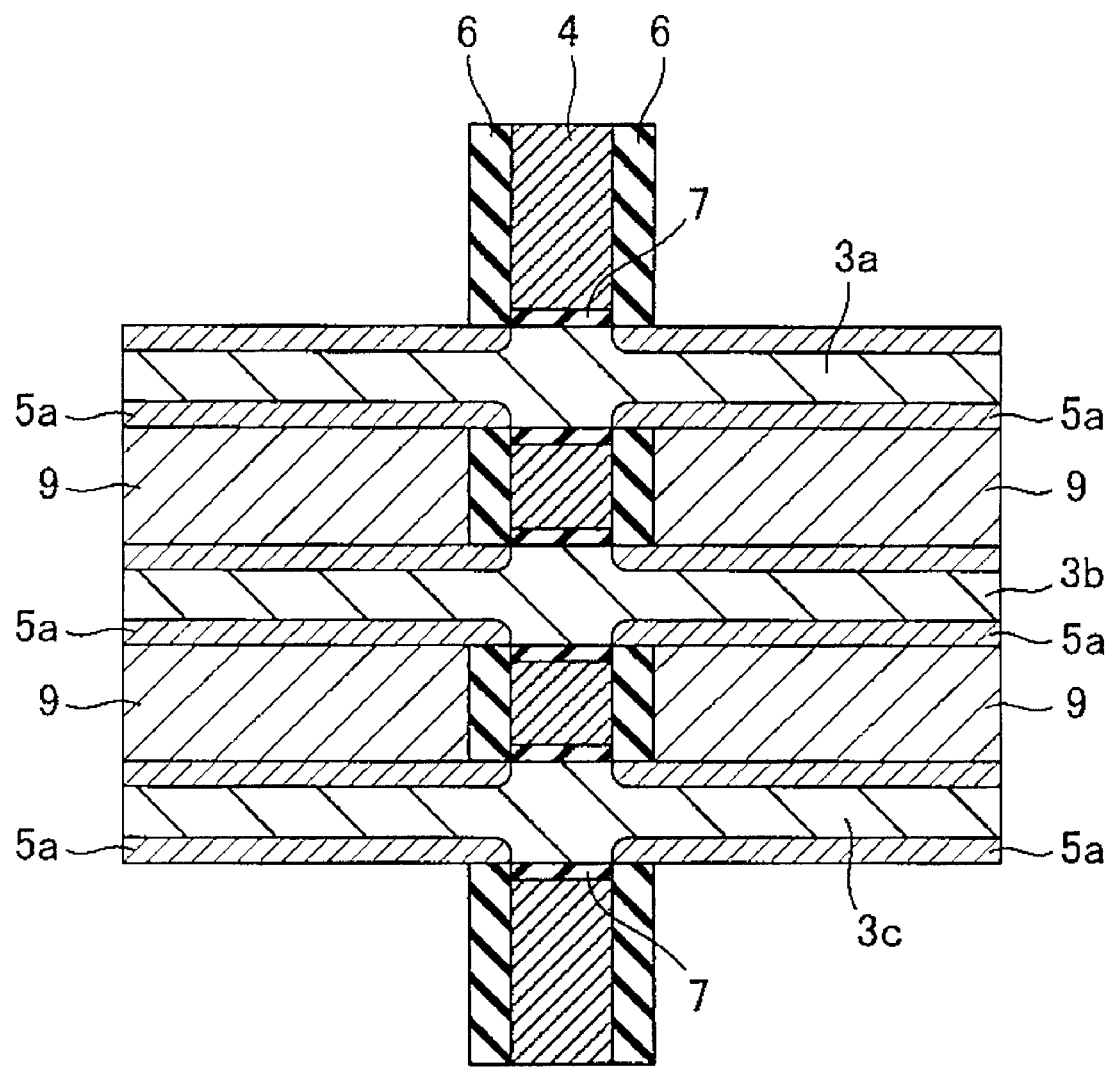
Figure 16:
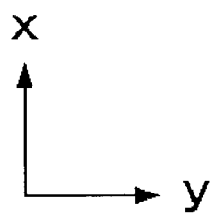

Then, as shown in FIG. 16, the growth control films 11 are removed by wet etching.

Thereafter, the source/drain regions 5 and the silicide layers 10 are formed as similar to the first embodiment.

EFFECT OF SECOND EMBODIMENT

According to the second embodiment of the present invention, as similar to the first embodiment, the epitaxial layers 9 are partially formed on the surfaces of the fins 3a to 3c, thus preventing the bodies of the fins 3a to 3c from being entirely silicided. Moreover, the growth control films 11 is formed on each of the side surfaces, parallel to the thickness direction, of the fins 3a to 3c, as well as on each of the side surfaces, opposite to the side surfaces facing the fin 3b, of the fins 3a and 3c, so that formation of the epitaxial layers 9 is controlled in the growth control region 8. This prevents the semiconductor device 1 from coming in contact with other devices adjacent thereto, thus preventing short circuit between the devices, and the like.

THIRD EMBODIMENT

A third embodiment of the present invention is different from the first embodiment in that the regions between the fins 3a to 3c are not completely filled with the epitaxial layers 9. Accordingly, description of similar points to the first embodiment, such as configurations of the components other than the epitaxial layers 9 will be omitted.

Figure 17:
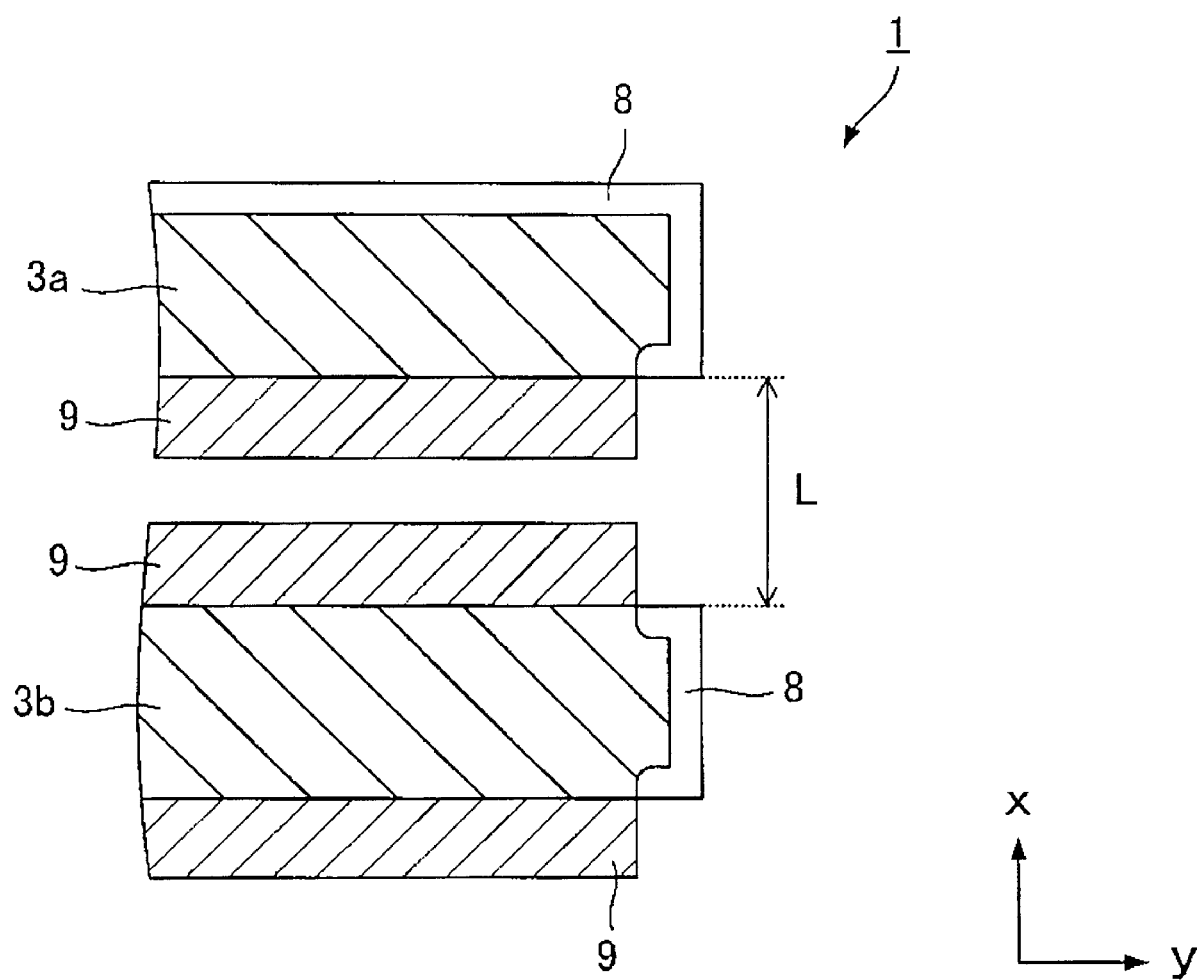
FIG. 17 is an enlarged cross-sectional view of a semiconductor device 1 according to the third embodiment of the present invention.

FIG. 17 is an enlarged cross-sectional view of a semiconductor device 1 according to the third embodiment of the present invention. Note that FIG. 17 is an enlarged view of part of a cross section corresponding to the cross sections shown in FIGS. 2A and 2B. Moreover, the source/drain regions 5, the extension regions 5a, and the silicide layers 10 are not shown in FIG. 17.

As shown in FIG. 17, the regions between the fins 3a to 3c are not completely filled with the epitaxial layers 9. This means that the epitaxial layers 9 have a thickness less than half of L. This is for the following reasons.

Here, the fin 3a is taken up as an example. In the side surface, facing the fin 3b, no growth control region 8 is formed. The epitaxial layer 9 which is being grown on this side surface becomes contact with the different epitaxial layer 9 which is being grown on the adjacent side surface of the fin 3b, when the thickness of the epitaxial layers 9 reaches approximately half of L. At this time, the region between the fins 3a and 3b is filled up with the epitaxial layers 9. In contrast, in this embodiment, the epitaxial layers 9 are stopped growing before the epitaxial layer 9 which is being grown on the side surface, facing the fin 3b and provided with no growth control region 8, of the fin 3a becomes contact with the different epitaxial layer 9 which is being grown on the adjacent side surface of the fin 3b. Accordingly, the epitaxial layers 9 that are grown on the side surface have a thickness less than half of L.

On the other hand, in regions on the side surfaces, opposite to the side surfaces facing the fin 3b, of the fins 3a and 3c, the epitaxial layers 9 have a thickness of 0, since no epitaxial layer 9 is formed on the growth control regions 8, in this embodiment as similar to the first embodiment.

Moreover, this embodiment can be combined with the second embodiment.

EFFECT OF THIRD EMBODIMENT

According to the third embodiment of the present invention, as similar to the first embodiment, the epitaxial layers 9 are partially formed on the surfaces of the fins 3a to 3c, thus preventing the bodies of the fins 3a to 3c from being entirely silicided. Moreover, in this embodiment, the epitaxial layers 9 are caused to stop growing earlier than in the first embodiment, so that the epitaxial layers 9 can be more positively prevented from being formed on the growth control regions 8. This more surely prevents the semiconductor device 1 from coming in contact with other devices adjacent thereto, thus more surely preventing short circuit between the devices, and the like.

FOURTH EMBODIMENT

A fourth embodiment of the present invention is different from the first embodiment in that the epitaxial layers 9 are formed on surfaces of the growth control regions. Accordingly, description of similar points to the first embodiment, such as configurations of the components other than the epitaxial layers 9 will be omitted.

Figure 18:
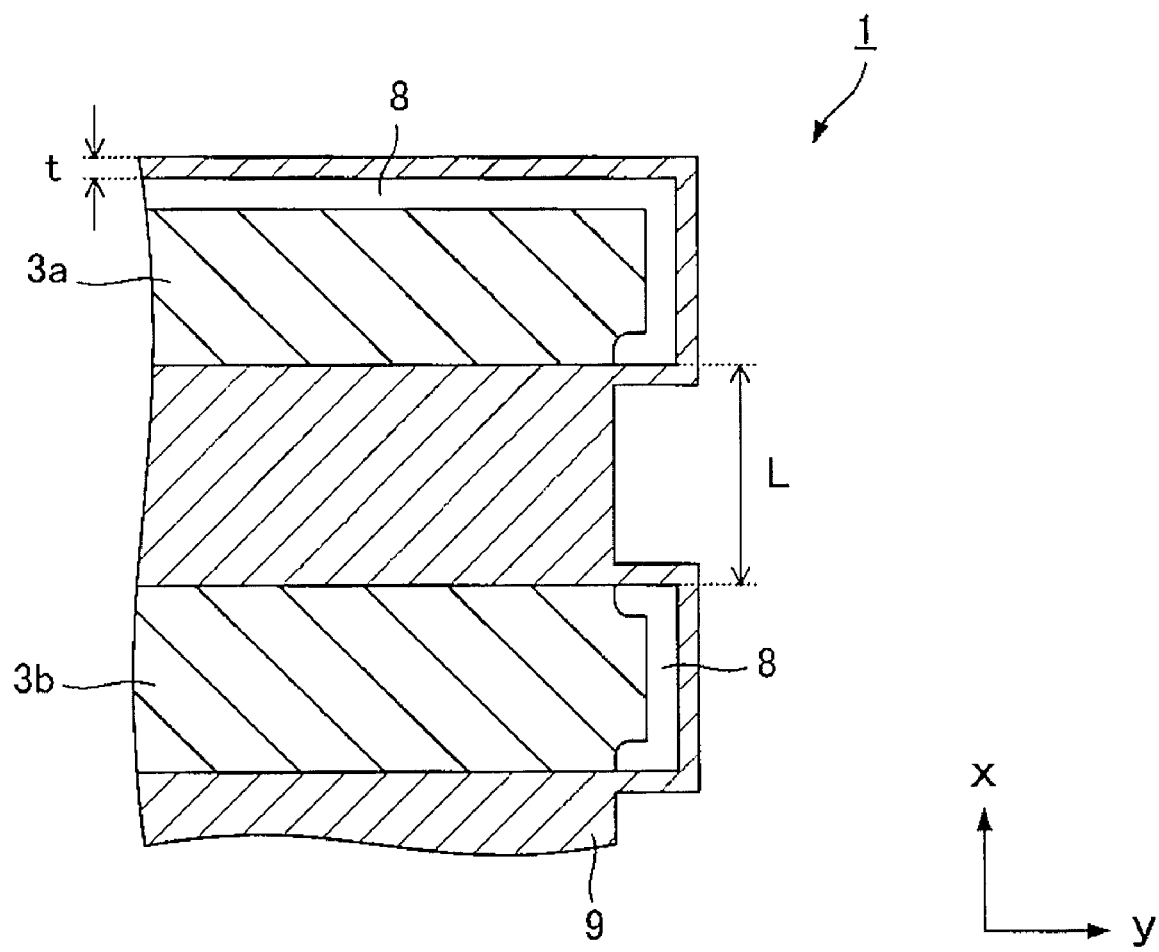
FIG. 18 is an enlarged cross-sectional view of a semiconductor device 1 according to the fourth embodiment of the present invention.

FIG. 18 is an enlarged cross-sectional view of a semiconductor device 1 according to the fourth embodiment of the present invention. Note that FIG. 18 is an enlarged view of part of a cross section corresponding to the cross sections shown in FIGS. 2A and 2B. Moreover, the source/drain regions 5, the extension regions 5a, and the silicide layers 10 are not shown in FIG. 18.

If it is assumed that t denotes the thickness of the epitaxial layers 9 that are formed on the surfaces of the growth control regions 8 while L denotes the distance between each adjacent two of the fins 3a and 3c, t should preferably be less than half of L. This relation of t to L is determined for the following reasons.

Here, the fin 3a is taken up as an example. In the side surface, facing the fin 3b, no growth control region 8 is formed. The epitaxial layer 9 which is being grown on this side surface becomes contact with the different epitaxial layer 9 which is being grown on the adjacent side surface of the fin 3b, when the thickness of the epitaxial layers 9 reaches approximately half of L. At this time, the region between the fins 3a and 3b is filled up with the epitaxial layers 9. Accordingly, in the case where the region between the fins 3a and 3b are filled up with the epitaxial layers 9, it is possible to minimize the thickness of the epitaxial layers 9 that are formed on the surface of the growth control regions 8 if the epitaxial layers 9 are stopped growing at the following timing. Specifically, the timing is when the epitaxial layer 9 which is being grown on the side surface, facing the fin 3b and provided with no growth control region 8, of the fin 3a becomes grown to have a thickness of half of L. In this condition, the thickness t of the epitaxial layers 9 that are formed on the surfaces of the growth control regions 8 becomes less than half of L, since the crystals in the regions in which the growth control regions 8 are formed grow at a lower speed than those in the regions in which no growth control region 8 is formed.

On the other hand, in the case where the region between the fins 3a and 3b is not completely filled with the epitaxial layers 9 as similar to the third embodiment, the epitaxial layer 9 that is grown on the side surface, facing the fin 3b and provided with no growth control region 8, of the fin 3a has a thickness less than half of L. Accordingly, the thickness of the epitaxial layers 9 in the regions in which the growth control regions 8 is even thinner than that of the epitaxial layers 9 in the regions in which no growth control region 8 is formed.

EFFECT OF FOURTH EMBODIMENT

According to the fourth embodiment of the present invention, the epitaxial layers 9 are formed on the growth control regions 8 only to the extent that the epitaxial layers 9 would not be in contact with other devices adjacent thereto, so that the bodies of the fins 3a to 3c can be more surely prevented from being entirely silicided.

For example, although the silicide layers 10 are respectively formed on the exposed surfaces of the epitaxial layers 9 and the fins 3a to 3c in the aforementioned embodiments, a configuration may be employed in which the silicide layers 10 are not formed. Even in the case where the silicide layers 10 are not formed, charge mobility in the channel region can be improved. This is achieved by, for example, employing, as material for the epitaxial layers 9, crystals having a lattice constant different from that of the crystals constituting the fins 3a to 3c, and thus by providing strain to the channel region.

Specifically, in the case where the semiconductor device 1 is a p-type transistor, and where the fins 3a to 3c consist of Si crystals, the epitaxial layers 9 should consist of crystals, such as SiGe crystals, that have a larger lattice constant than that of Si crystals. This provides compression strain to the channel region, so that hole mobility in the channel region can be improved. In contrast, in the case where the semiconductor device 1 is an n-type transistor, and where the fins 3a to 3c consist of Si crystals, the epitaxial layers 9 should consist of crystals, such as SiC crystals, that have a smaller lattice constant than that of Si crystals. This provides tensile strain to the channel region, so that electron mobility in the channel region can be improved.

Embodiments of the invention have been described with reference to the examples. However, the invention is not limited thereto.

Other embodiments of the present invention will be apparent to those skilled in the art from consideration of the specification and practice of the invention disclosed herein. It is intended that the specification and example embodiments be considered as exemplary only, with a true scope and spirit of the invention being indicated by the following.

What is claimed is:

1. A semiconductor device, comprising:
    a semiconductor substrate;
    a plurality of fins disposed substantially parallel to each other at predetermined intervals on the semiconductor substrate;
    a gate electrode formed to partially sandwich therein the both side surfaces, in the longitudinal direction, of each of the plurality of fins with an insulating film interposed between the gate electrode and each of the side surfaces of each fin; and
    a semiconductor layer formed on each of at least some of side surfaces of the plurality of fins,
    wherein the semiconductor layer in a region located on an outer side surface, in the longitudinal direction, of each of two fins which are located at both ends of the line of the plurality of fins is thinner than the semiconductor layer in a region located on each of side surfaces, in the longitudinal direction and other than the outer surfaces of the two fins, of the plurality of fins.

2. The semiconductor device according to claim 1, wherein each of the semiconductor layers consists of an epitaxial crystal, and
    in the outer side surface of each of the two fins, a growth control layer for controlling epitaxial crystal growth is formed.

3. The semiconductor device according to claim 2, wherein each of the plurality of fins consists of a first crystal which is a Si-based crystal, and
    each of the growth control layers consists of a second crystal which is another Si-based crystal containing an impurity and thereby having a lattice constant different from that of the first crystal.

4. The semiconductor device according to claim 2, wherein the growth control layers are insulating layers formed on the respective outer side surfaces of the two fins.

5. The semiconductor device according to claim 1, wherein the semiconductor layers are not formed on the outer side surfaces of the two fins.

* * * * *